(12) United States Patent
Kamimura et al.

(10) Patent No.: US 10,626,356 B2
(45) Date of Patent: Apr. 21, 2020

(54) TREATMENT LIQUID AND METHOD FOR WASHING SUBSTRATE

(71) Applicant: FUJIFILM Corporation, Tokyo (JP)

(72) Inventors: Tetsuya Kamimura, Haibara-gun (JP); Satomi Takahashi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/236,695

(22) Filed: Dec. 31, 2018

(65) Prior Publication Data

US 2019/0136161 A1 May 9, 2019

Related U.S. Application Data

(63) Continuation of application No. PCT/JP2017/025471, filed on Jul. 13, 2017.

(30) Foreign Application Priority Data

Jul. 29, 2016 (JP) ................. 2016-150623

(51) Int. Cl.
| | | |
|---|---|---|
| *C11D 7/18* | (2006.01) | |
| *C11D 11/00* | (2006.01) | |
| *C11D 3/39* | (2006.01) | |
| *H01L 21/02* | (2006.01) | |
| *C11D 3/00* | (2006.01) | |
| *H01L 21/768* | (2006.01) | |
| *C11D 7/10* | (2006.01) | |

(Continued)

(52) U.S. Cl.
CPC ............ *C11D 11/0047* (2013.01); *B08B 3/10* (2013.01); *C11D 3/0073* (2013.01); *C11D 3/3947* (2013.01); *C11D 7/04* (2013.01); *C11D 7/08* (2013.01); *C11D 7/10* (2013.01); *C11D 7/26* (2013.01); *C11D 7/265* (2013.01); *C11D 7/268* (2013.01); *C11D 7/3245* (2013.01); *C11D 7/34* (2013.01); *C11D 7/5022* (2013.01); *H01L 21/02057* (2013.01); *H01L 21/02063* (2013.01); *H01L 21/768* (2013.01); *C11D 7/3281* (2013.01); *C11D 7/5004* (2013.01); *H01L 21/31144* (2013.01)

(58) Field of Classification Search
CPC .................................... C11D 11/0047
USPC ........................................ 510/175
See application file for complete search history.

(56) References Cited

U.S. PATENT DOCUMENTS 8,900,371 B2 * 12/2014 Mizuta ................... C11D 7/261
                                                                    134/1.2
2017/0183537 A1 * 6/2017 Yoon ........................ C09G 1/02
(Continued)

FOREIGN PATENT DOCUMENTS

| JP | 8-245204 A | 9/1996 |
|---|---|---|
| JP | 2010-087326 A | 4/2010 |

(Continued)

OTHER PUBLICATIONS

International Search Report, issued by International Searching Authority in corresponding International Application No. PCT/JP2017/025471, dated Oct. 3, 2017.
(Continued)

*Primary Examiner* — Gregory E Webb
(74) *Attorney, Agent, or Firm* — Sughrue Mion, PLLC

(57) ABSTRACT

A treatment liquid is a treatment liquid for a semiconductor device containing an oxidizing agent, a corrosion inhibitor, water, and Fe, in which the content ratio of the Fe to the oxidizing agent is $10^{-10}$ to $10^{-4}$ in terms of mass ratio.

17 Claims, 1 Drawing Sheet

(51) Int. Cl.
  *C11D 7/26* (2006.01)
  *B08B 3/10* (2006.01)
  *C11D 7/04* (2006.01)
  *C11D 7/08* (2006.01)
  *C11D 7/32* (2006.01)
  *C11D 7/34* (2006.01)
  *C11D 7/50* (2006.01)
  *H01L 21/311* (2006.01)

(56) References Cited

U.S. PATENT DOCUMENTS

2017/0330763 A1* 11/2017 Kamei ............... H01L 21/3212
2019/0062159 A1* 2/2019 Kamimura ............ C01B 15/023

FOREIGN PATENT DOCUMENTS

WO 2011/093445 A1 8/2011
WO 2016/076033 A1 5/2016

OTHER PUBLICATIONS

International Preliminary Report on Patentability with a Translation of Written Opinion issued from the International Bureau in counterpart International Application No. PCT/JP2017/025471, dated Jan. 29, 2019.

Written Opinion issued by the International Bureau in corresponding International Application No. PCT/JP2017/025471, dated Oct. 3, 2017.

* cited by examiner

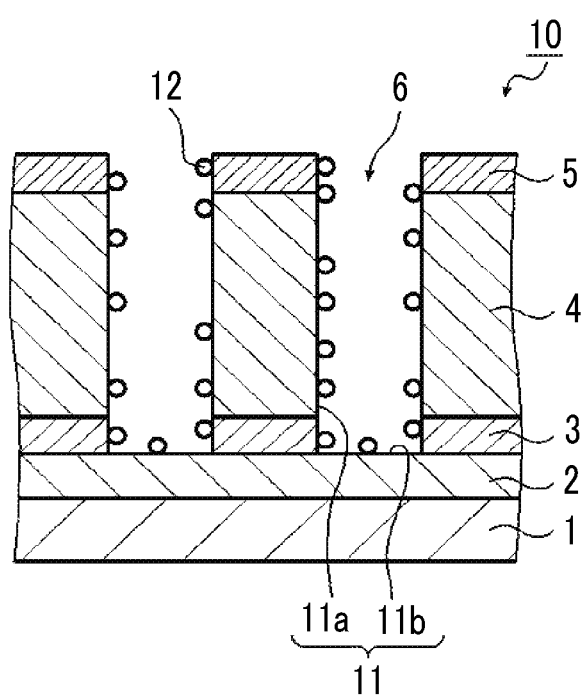

TREATMENT LIQUID AND METHOD FOR WASHING SUBSTRATE

CROSS-REFERENCE TO RELATED APPLICATIONS

This application is a Continuation of PCT international Application No. PCT/JP2017/025471, filed on Jul. 13, 2017, which claims priority under 35 U.S.C. § 119(a) to Japanese Patent Application No. 2016-150623, filed on Jul. 29, 2016. Each of the above application(s) is hereby expressly incorporated by reference, in its entirety, into the present application.

BACKGROUND OF THE INVENTION

1. Field of the Invention

The present invention relates to a treatment liquid which can be used in semiconductor device applications and a method for washing a substrate.

2. Description of the Related Art

A semiconductor device such as a charge-coupled device (CCD) and a memory is manufactured by forming fine electronic circuit patterns on a substrate using a photolithographic technique. Specifically, the semiconductor device is manufactured by forming a resist film on a laminate having a metal film that serves as a wiring material, an etching stop film, and an interlayer insulating film on a substrate, followed by carrying out a photolithography step and a dry etching step (for example, a plasma etching treatment).

Furthermore, a dry ashing step (for example, a plasma ashing treatment) for peeling the resist film is performed, as desired.

In recent years, a metal material-based resist film (a so-called metal hard mask) such as TiN and $AlO_x$ has been studied as the resist film in order to realize further miniaturization.

In the case where the metal hard mask is used as the resist film, usually, a dry etching step (for example, a plasma etching treatment) is performed using the metal hard mask as a mask, and a step of exposing a surface of a metal film serving as a wiring film by forming a hole based on the pattern shape of the metal hard mask is performed.

In the substrate which has been subjected to the dry etching step, dry etching residues adhere onto the metal film and/or the interlayer insulating film (particularly, in the case where the metal hard mask is used as the resist film, a large amount of metal components such as a titanium-based metal are included as residue components), and a treatment for washing and removing the components with a treatment liquid is generally performed.

On the other hand, WO2011/093445A discloses a wet etching liquid appropriate in copper/titanium-based multi-layer thin film applications, "which includes (A) hydrogen peroxide, (B) nitric acid, (C) a fluorine ion source, (D) azoles, (E) quaternary ammonium hydroxide, and (F) a hydrogen peroxide stabilizer".

SUMMARY OF THE INVENTION

However, a treatment liquid for use in the manufacture of a semiconductor device can also be used in applications for washing a substrate having dry etching residues or dry ashing residues adhering onto a surface thereof as described above, and the like.

In such various removal treatments, a metal layer such as a wiring material and a plug material provided on a substrate is in contact with a treatment liquid in some cases. In this case, the treatment liquid in contact with the metal layer corrodes the metal layer in some cases, and as a result, desired performance for a semiconductor device cannot be obtained in some cases.

The present inventors have produced a treatment liquid for a semiconductor device with reference to the composition of the etching liquid described in WO2011/093445A, and washed a substrate having the above-mentioned dry etching residues or dry ashing residues (hereinafter also simply referred to as "residues") adhering onto a surface thereof, and as a result, they have found that the anticorrosion property of a metal layer was good, but the residue removing property was required to be further improved. In addition, upon observing the washed substrate, the present inventors have found that by adhesion of particles to the substrate, many defects are generated.

Therefore, an object of the present invention is to provide a treatment liquid which has an excellent anticorrosion property with respect to a metal layer included in a semiconductor device and an excellent residue removing property, and is capable of suppressing the generation of defects.

In addition, another object of the present invention is to provide a method for washing a substrate.

The present inventors have conducted extensive studies to achieve on the objects, and as a result, they have found that by incorporating Fe at a specific ratio with respect to the oxidizing agent into a treatment liquid, the objects can be accomplished, thereby leading to completion of the present invention.

That is, the present inventors have found that the objects can be accomplished by the following configurations.

(1) A treatment liquid for a semiconductor device, comprising:
an oxidizing agent;
a corrosion inhibitor;
water; and
Fe,
in which the content ratio of the Fe to the oxidizing agent is $10^{-10}$ to $10^{-4}$ in terms of mass ratio.

(2) The treatment liquid as described in (1),
in which the oxidizing agent is hydrogen peroxide.

(3) The treatment liquid as described in (1) or (2),
in which the content ratio of the Fe to the corrosion inhibitor is $10^{-10}$ to $10^{-4}$ in terms of mass ratio.

(4) The treatment liquid as described in any one of (1) to (3),
in which the content of the Fe is 0.1 ppt by mass to 10 ppb by mass with respect to the total mass of the treatment liquid.

(5) The treatment liquid as described in any one of (1) to (4), further comprising an organic solvent.

(6) The treatment liquid as described in (5),
in which the content of the water is 20% to 98% by mass, and
the content of the organic solvent is 1% to 40% by mass, with respect to the total mass of the treatment liquid.

(7) The treatment liquid as described in (5),
in which the content of the water is 1% to 40% by mass, and
the content of the organic solvent is 20% to 98% by mass, with respect to the total mass of the treatment liquid.

(8) The treatment liquid as described in any one of (1) to (7), further comprising a polyfunctional organic acid.

(9) The treatment liquid as described in (8), in which the content ratio of the Fe to the polyfunctional organic acid is $10^{-10}$ to $10^{-4}$ in terms of mass ratio.

(10) The treatment liquid as described in (8) or (9), in which the concentration of a complex salt formed by complexing the polyfunctional organic acid with the Fe ion in the treatment liquid is 10 ppt by mass to 5 ppb by mass.

(11) The treatment liquid as described in any one of (1) to (10), further comprising a halide.

(12) The treatment liquid as described in any one of (1) to (11), in which the pH of the treatment liquid is −3.0 to 5.0.

(13) The treatment liquid as described in any one of (1) to (12), in which in the case where the viscosity of the treatment liquid at 25° C. is measured using a rotational viscometer, the ratio of the viscosity of the treatment liquid at a rotation speed of 100 rpm to the viscosity of the treatment liquid at a rotation speed of 1,000 rpm is 1 to 20.

(14) The treatment liquid as described in any one of (1) to (13), in which the semiconductor device has a substrate comprising a metal layer including Co, and the treatment liquid is used in a treatment for the metal layer.

(15) The treatment liquid as described in any one of (1) to (13), in which the semiconductor device has a substrate comprising a metal layer including W, and the treatment liquid is used in a treatment for the metal layer.

(16) The treatment liquid as described in any one of (1) to (13), in which the semiconductor device has a substrate comprising an insulating layer including any one selected from SiOx, SiOC, or SiN, and the treatment liquid is used in a treatment for the insulating layer.

(17) The treatment liquid as described in any one of (1) to (16), in which the corrosion inhibitor includes at least one compound selected from a triazole represented by Formula (A) which will be described later, a boronic acid represented by Formula (B) which will be described later, a metal chloride represented by Formula (C) which will be described later, a substituted or unsubstituted tetrazole, or a surfactant.

(18) A method for washing a substrate, comprising a washing step B that washes a substrate comprising a metal layer including Co using the treatment liquid as described in any one of (1) to (14), and (17).

(19) The method for washing a substrate as described in (18), further comprising:

a drainage recovering step C that recovers a drainage of the treatment liquid used in the washing step B;

a washing step D that washes a newly prepared substrate comprising a metal layer including Co using the recovered drainage of the treatment liquid;

a drainage recovering step E that recovers a drainage of the treatment liquid used in the washing step D; and a step that repeats the washing step D and the drainage recovering step E.

(20) The method for washing a substrate as described in (18) or (19), further comprising:

a treatment liquid preparing step A that prepares the treatment liquid before the washing step B; and at least one step of an ion removing step F that removes Fe ions from at least one of the oxidizing agent, the water, or the corrosion inhibitor before the treatment liquid preparing step A, or an ion removing step G that removes Fe ions in the treatment liquid after the treatment liquid preparing step A and before performing the washing step B.

(21) The method for washing a substrate as described in any one of (18) to (20), further comprising:

a treatment liquid preparing step A that prepares the treatment liquid before the washing step B; and at least one step of a charge eliminating step I subjects the water to charge elimination before the treatment liquid preparing step A or a charge eliminating step J that subjects the treatment liquid to charge elimination after the treatment liquid preparing step A and before performing the washing step B.

According to the present invention, it is possible to provide a treatment liquid which has an excellent anticorrosion property with respect to a metal layer included in a semiconductor device and an excellent residue removing property, and is capable of suppressing the generation of defects.

In addition, the present invention can provide a method for washing a substrate.

BRIEF DESCRIPTION OF THE DRAWING

FIG. 1 is a schematic cross-sectional view showing an example of a laminate which can be applied to a method for washing a substrate according to an embodiment of the present invention.

DESCRIPTION OF THE PREFERRED EMBODIMENTS

Hereinbelow, the present invention will be described in detail.

Description of configuration requirements described below may be made on the basis of representative embodiments of the present invention in some cases, but the present invention is not limited to such embodiments.

Furthermore, in the present specification, the numerical value ranges shown using "to" mean ranges including the numerical values indicated before and after "to" as the lower limit value and the upper limit value, respectively.

Moreover, in the present invention, a reference to "preparation" is meant to encompass delivering a predetermined material by purchases or the like, in addition to comprising specific materials by synthesis, combination, or the like.

Incidentally, in the present invention, "ppm" means "parts-per-million ($10^{-6}$)", "ppb" means "parts-per-billion ($10^{-9}$)", "ppt" means "parts-per-trillion ($10^{-12}$)", and "ppq" means "parts-per-quadrillion ($10^{-15}$)".

Furthermore, in the present invention, 1 Å (angstrom) corresponds to 0.1 nm.

In addition, in citations for a group (atomic group) in the present invention, in the case where the group (atomic group) is denoted without specifying whether it is substituted or unsubstituted, the group (atomic group) includes both a group (atomic group) having no substituent and a group (atomic group) having a substituent within a range not impairing the effects of the present invention. For example, a "hydrocarbon group" includes not only a hydrocarbon group having no substituent (unsubstituted hydrocarbon group) but also a hydrocarbon group having a substituent (substituted hydrocarbon group). This also applies to the respective compounds.

In addition, "radiation" in the present invention means, for example, a bright line spectrum of a mercury lamp, far ultraviolet rays typified by excimer laser, extreme ultraviolet rays (EUV light), X-rays, or electron beams. Further, the term "light" in the present invention means actinic rays or radiation. Unless otherwise indicated, the term "exposure" in the present invention includes not only exposure to a mercury lamp, far ultraviolet rays typified by excimer laser, X-rays, EUV light, or the like but also exposure using lithography with particle beams such as electron beams and ion beams.

[Treatment Liquid]

The treatment liquid according to an embodiment of the present invention is a treatment liquid for a semiconductor device, containing an oxidizing agent, a corrosion inhibitor, water, and Fe, in which the content ratio of the Fe to the oxidizing agent is $10^{-10}$ to $10^{-4}$ in terms of mass ratio.

With the configuration as described above, the treatment liquid according to the embodiment of the present invention has an excellent anticorrosion property with respect to a metal layer included in a semiconductor device and an excellent residue removing property, and is capable of suppressing the generation of defects.

It is believed that Fe is present to a certain degree in raw material components and incorporated into a composition through the raw material components. Further, in the present specification, Fe may be in any form of ionic Fe and nonionic Fe (for example, Fe particles). That is, Fe means any of Fe atoms included in the treatment liquid.

The present inventors have presumed that Fe is one of the causes of a decrease in a residue removing property. That is, it is believed that Fe affects an oxidizing agent, and thus, lowers the residue removing property. For example, it is believed that in the case where the oxidizing agent is hydrogen peroxide, decomposition of hydrogen peroxide via a so-called Fenton reaction is caused, which leads to a decrease in a residue removing property. In addition, a case where Fe (particularly, ionic Fe) easily adheres onto a silicon substrate, and thus causes defects was found.

In contrast, it was found that upon the use of a treatment liquid with a Fe concentration reduced by subjecting raw material components to ion exchange, filtering, or the like, the number of defects generated increases in the case where the mass ratio of Fe/oxidizing agent is more than $10^{-4}$, and also, the residue removing property decreases. On the other hand, although the mechanism is unclear, in the case where the content ratio of Fe to oxidizing agent (Fe/oxidizing agent (mass ratio)) is less than $10^{-10}$, the number of defects generated increased to the contrary.

That is, it was found in the case where the content ratio of the Fe to the oxidizing agent is $10^{-10}$ to $10^{-4}$ in terms of mass ratio, it is possible to suppress the generation of defects with an excellent residue removing property.

Moreover, the content of Fe in the treatment liquid is preferably 100 ppb by mass or less, more preferably 50 ppb by mass or less, still more preferably 10 ppb by mass or less, and particularly preferably 800 ppt by mass or less. In the treatment liquid, in the case where the content of Fe is 100 ppb by mass or less, adhesion of Fe on the substrate is less likely to occur, and that is, generation of defects is further suppressed.

On the other hand, the content of Fe in the treatment liquid is preferably 0.1 ppt by mass or more. It is believed that in a region with a low Fe concentration, Fe ions in the form of a hydrate in the liquid is condensed to take a form of a hydroxide colloid. In the case where the content of Fe is 0.1 ppt by mass or more, the hydroxide colloid has a weak action as a positive colloid and is difficult to be adsorbed onto an oxidized film having a slightly higher negative zeta potential than that of a silicon surface, and thus, generation of defects is further suppressed. Further, in the case where the content of Fe is small, it is also relatively necessary to reduce the content of the oxidizing agent, and therefore, it is difficult to obtain a desired effect in the residue removing property. From the viewpoint of making it more difficult for defects to be generated, the content of Fe is preferably 0.1 ppt by mass to 10 ppb by mass.

Moreover, in the present invention, the content of Fe (in other words, the content of Fe atoms) is measured by an inductively coupled plasma mass spectrometry (ICP-MS) method. Measurement of the content of Fe atoms by the ICP-MS method can be performed, for example, using the apparatus according to NexION350S (trade name, manufactured by PerkinElmer, Inc.).

The content of Fe can be adjusted by excessively subjecting raw material components or a solution obtained by mixing the raw material components to ion exchange, filtering, or the like in the process for preparing the treatment liquid according to the embodiment of the present invention. In the process for preparing the treatment liquid according to the embodiment of the present invention, an aspect in which Fe atoms are removed by purification to less than the lower limit of the predetermined numerical value range, and then an additive including Fe atoms is added thereto to a predetermined numerical value range.

Furthermore, the content ratio of the Fe to the corrosion inhibitor in the treatment liquid is preferably $10^{-10}$ to $10^{-4}$ in terms of mass ratio. By setting the content ratio of the Fe to the corrosion inhibitor (Fe/corrosion inhibitor) within the range, it is possible to achieve both an anticorrosion property with respect to a metal layer included in a semiconductor device and a residue removing property at more excellent levels.

The treatment liquid preferably further includes a polyfunctional organic acid.

The polyfunctional organic acid is complexed with ionic Fe (Fe ions) included in the liquid to form a complex salt and has an effect of suppressing adhesion of the Fe ions to the substrate.

The content ratio of Fe to the polyfunctional organic acid in the treatment liquid is preferably $10^{-10}$ to $10^{-4}$ in terms of mass ratio. By setting the content ratio of the Fe to the polyfunctional organic acid (Fe/polyfunctional organic acid) in terms of mass ratio to $10^{-10}$ or more, the effect of suppressing adhesion of the Fe ions to the substrate is more excellent. On the other hand, by setting the content ratio of the Fe to the polyfunctional organic acid (Fe/polyfunctional organic acid) in terms of mass ratio to $10^{-4}$ or less, the concentration of complex salts formed from the polyfunctional organic acid and the Fe ions does not increase, and adhesion of the complex salt to the substrate is suppressed. From the viewpoint of further suppressing the adhesion of the complex salt to the substrate, the content of the complex salt formed by complexing the polyfunctional organic acid with the Fe ions in the treatment liquid is preferably 5 ppb by mass or less, and more preferably 3 ppb by mass or less. On the other hand, in the case where the content of the complex salt formed by complexing the polyfunctional organic acid with the Fe ions is 10 ppt by mass or more, an excellent residue removing property, excellent detect suppressing performance, and excellent temporal stability can be achieved.

Furthermore, by setting the content ratio of the Fe to the polyfunctional organic acid within the range, the anticorrosion property is also more excellent.

In addition, in the present invention, the content of the complex salt formed by complexing the polyfunctional organic acid with the Fe ions is measured by high performance liquid chromatography (HPLC).

Hereinbelow, the components which are included or can be included in the treatment liquid according to the embodiment of the present invention will be described.

<Oxidizing Agent>

The treatment liquid according to the embodiment of the present invention contains an oxidizing agent. The oxidizing agent has a function to decompose or solubilize residues.

The oxidizing agent may be any of compounds having an oxidizing action. Among those, from the viewpoint that the anticorrosion property with respect to a metal layer included in a semiconductor device is more excellent, at least one compound selected from the group consisting of hydrogen peroxide, ammonium persulfate, perchloric acid, chlorous acid, hypochlorous acid, nitric acid, perchloric acid, permanganic acid, periodic acid, hypoiodite, periodic acid, and orthoperiodic acid is preferable, and the hydrogen peroxide is more preferable.

The content of the oxidizing agent is preferably 0.01% to 10% by mass, and more preferably 0.01% to 5% by mass, with respect to the total mass of the treatment liquid.

Furthermore, the oxidizing agent may be used singly or in combination of two or more kinds thereof. In the case where two or more kinds of the oxidizing agents are used in combination, the total content thereof is preferably within the range.

<Corrosion Inhibitor>

The treatment liquid according to the embodiment of the present invention contains a corrosion inhibitor.

The corrosion inhibitor has a function of solving the overetching of a metal layer (particularly Co or W) which serves as wiring of a semiconductor device, or the like. The corrosion inhibitor may be referred to as an anticorrosion agent in some cases.

The corrosion inhibitor is not particularly limited, and examples thereof include 1,2,4-triazole (TAZ), 5-aminotetrazole (ATA), 5-amino-1,3,4-thiadiazole-2-thiol 3-amino-1H-1,2,4-triazole, 3,5-diamino-1,2,4-triazole, tolyltriazole, 3-amino-5-mercapto-1-amino-1,2,4-triazole, 1-amino-1,2,3-triazole, 1-amino-5-methyl-1,2,3-triazole, 3-mercapto-1,2,4-triazole, 3-isopropyl-1,2,4-triazole, naphthotriazole, 1H-tetrazol-5-acetic acid, 2-mercaptobenzothiazole (2-MBT), 1-phenyl-2-tetrazoline-5-thione, 2-mercaptobenzimidazole (2-MBI), 4-methyl-2-phenylimidazole, 2-mercaptothiazoline, 2,4-diamino-6-methyl-1,3,5-triazine, imidazole, benzimidazole, triazine, methyltetrazole, bismuthiol I, 1,3-dimethyl-2-imidazolidinone, 1,5-pentamethylenetetrazole, 1-phenyl-5-mercaptotetrazole, diaminomethyltriazine, imidazolinethione, 4-methyl-4H-1,2,4-triazole-3-thiol, 5-amino-1,3,4-thiadiazole-2-thiol, benzothiazole, tritolyl phosphate, indazole, adenine, cytosine, guanine, thymine, a phosphate inhibitor, amines, pyrazoles, propanethiol, silanes, secondary amines, benzohydroxamic acids, a heterocyclic nitrogen inhibitor, ascorbic acid, thiourea, 1,1,3,3-tetramethylurea, urea, urea derivatives, uric acid, potassium ethylxanthate, glycine, dodecyl phosphonic acid, iminodiacetic acid, boric acid, malonic acid, succinic acid, nitrilotriacetic acid, sulfolane, 2,3,5-trimethylpyrazine, 2-ethyl-3,5-dimethyl pyrazine, quinoxaline, acetylpyrrole, pyridazine, histadine, pyrazine, (reduced) glutathione, cysteine, cystine, thiophene, mercaptopyridine N-oxide, thiamine tetraethyl thiuram disulfide, 2,5-dimercapto-1,3-thiadiazole-ascorbic acid, catechol, t-butyl catechol, phenol, and pyrogallol.

In addition, it is also preferable that the substituted or unsubstituted benzotriazole is further included as the corrosion inhibitor. Suitable examples of the substituted benzotriazole include, but are not limited to, a benzotriazole substituted with an alkyl group, an aryl group, a halogen group, an amino group, a nitro group, an alkoxy group, or a hydroxyl group. Other examples of the substituted benzotriazole include benzotriazoles fused with one or more aryl groups (for example, a phenyl group) or heteroaryl groups.

Examples of the benzotriazole which is suitable for use as the corrosion inhibitor include, but are not limited to, benzotriazole (BTA), 5-aminotetrazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 3-amino-5-mercapto-1,2,4-triazole, 2-(5-amino-pentyl)-benzotriazole, 1-amino-benzotriazole, 5-methyl-1H-benzotriazole (5-MBTA), benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butylbenzotriazole, 5-(1',1'-dimethylpropyl)-benzotriazole, 5-(1',1',3'-trimethylbutyl)benzotriazole, 5-n-octylbenzotriazole, and 5-(1',1',3',3'-tetramethylbutyl)benzotriazole.

In addition, as the benzotriazole, 2,2'-{[(4-methyl-1H-benzotriazol-1-yl)methyl]imino}bisethanol, 2,2'-{[(5-methyl-1H-benzotriazol-1-yl)methyl]imino}bisethanol, 2,2'-{[(4-methyl-1H-benzotriazol-1-yl)methyl]imino}bisethane, or 2,2'-{[(4-methyl-1H-benzotriazol-1-yl)methyl]imino}bispropane, N,N-bis(2-ethylhexyl)-(4 or 5)-methyl-1H-benzotriazole-1-methylamine, or the like can also be used.

From the viewpoint of further improving the anticorrosion property, it is preferable that the corrosion inhibitor includes at least one compound selected from a triazole represented by Formula (A), a boronic acid represented by Formula (B), a metal chloride represented by Formula (C), a substituted or unsubstituted tetrazole, or a surfactant.

(Triazole Represented by Formula (A))

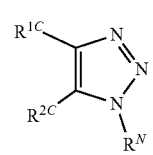

Formula (A)

In Formula (A), $R^{1C}$, $R^{2C}$, and $R^N$ each independently represent a hydrogen atom, or a substituted or unsubstituted hydrocarbon group. Further, $R^{1C}$ and $R^{2C}$ may be bonded to each other to form a ring.

In Formula (A), examples of the substituted or unsubstituted hydrocarbon group represented by $R^{1C}$, $R^{2C}$, and $R^N$ include an alkyl group (preferably having 1 to 12 carbon atoms, more preferably having 1 to 6 carbon atoms, and still more preferably having 1 to 3 carbon atoms), an alkenyl group (preferably having 2 to 12 carbon atoms, and more preferably having 2 to 6 carbon atoms), or an alkynyl group (preferably having 2 to 12 carbon atoms, and more preferably having 2 to 6 carbon atoms), an aryl group (preferably having 6 to 22 carbon atoms, more preferably having 6 to 14 carbon atoms, and still more preferably having 6 to 10 carbon atoms), and an aralkyl group (preferably having 7 to 23 carbon atoms, more preferably having 7 to 15 carbon atoms, and still more preferably having 7 to 11 carbon atoms).

Furthermore, examples of the substituent in the case where the hydrocarbon group is substituted include a hydroxyl group, a carboxyl group, and a substituted or unsubstituted amino group (the substituent in the case where the amino group is substituted is preferably an alkyl group having 1 to 6 carbon atoms, and more preferably an alkyl group having 1 to 3 carbon atoms).

Preferred examples of the substituted or unsubstituted hydrocarbon group represented by $R^{1C}$, $R^{2C}$, and $R^N$ include a hydrocarbon group having 1 to 6 carbon atoms, such as a methyl group, an ethyl group, a propyl group, and a butyl group.

Furthermore, $R^{1C}$ and $R^{2C}$ may be bonded to each other to form a ring, and examples of the ring include a benzene ring. In the case where $R^{1C}$ and $R^{2C}$ are bonded to each other to form a ring, they may further have a substituent (for example, a hydrocarbon group having 1 to 5 carbon atoms).

Examples of the compound represented by Formula (A) include 1H-1,2,3-triazole, benzotriazole, 5-methyl-1H-benzotriazole, 1,2,4-triazole, and 3-amino-1,2,4-triazole.

Moronic Acid Represented by Formula (B))

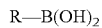　　　　　　　　　　　　　　　Formula (B)

In Formula (B), R represents a hydroxyl group, or a substituted or unsubstituted hydrocarbon group.

In Formula (B), examples of the substituted or unsubstituted hydrocarbon group represented by R include an alkyl group (preferably having 1 to 12 carbon atoms, more preferably having 1 to 6 carbon atoms, and still more preferably having 1 to 3 carbon atoms), an alkenyl group (preferably having 2 to 12 carbon atoms, and more preferably having 2 to 6 carbon atoms), an alkynyl group (preferably having 2 to 12 carbon atoms, and more preferably having 2 to 6 carbon atoms), or an aryl group (preferably having 6 to 22 carbon atoms, more preferably having 6 to 14 carbon atoms, and still more preferably having 6 to 10 carbon atoms), and an aralkyl group (preferably having 7 to 23 carbon atoms, more preferably having 7 to 15 carbon atoms, and still more preferably having 7 to 11 carbon atoms).

Furthermore, examples of the substituent in the case where the hydrocarbon group is substituted include a hydroxyl group, a carboxyl group, and a substituted or unsubstituted amino group (the substituent in the case where the amino group is substituted is preferably an alkyl group having 1 to 6 carbon atoms, and more preferably an alkyl group having 1 to 3 carbon atoms).

Examples of the compound represented by Formula (B) include boronic acid and phenylboronic acid.

(Metal Chloride Represented by Formula (C))

　　　　　　　　　　　　　　　Formula (C)

In Formula (C), M represents a cerium atom or a metal atom selected from Group 4, and x represents the valence of M.

M represents a cerium atom or a metal atom selected from Group 4, and examples of the metal atom selected from Group 4 include a titanium atom, a zirconium atom, and a hafnium atom. Further, x represents the valence of M, and is preferably 3.

(Substituted or Unsubstituted Tetrazole)

Examples of the substituted or unsubstituted tetrazole include an unsubstituted tetrazole, and a tetrazole having a hydroxyl group, a carboxyl group, or a substituted or unsubstituted amino group as a substituent. Here, the substituent in the case where the amino group is substituted is preferably an alkyl group having 1 to 6 carbon atoms, and more preferably an alkyl group having 1 to 3 carbon atoms.

(Surfactant)

As the surfactant, any one of an anionic surfactant, a nonionic surfactant, a cationic surfactant, and an amphoteric surfactant can be used. The nonionic surfactant or the anionic surfactant is more preferable, and the anionic surfactant is still more preferable.

(Cationic Surfactant)

Examples of the cationic surfactant include a tetraalkylammonium salt, an alkylamine salt, a benzalkonium salt, an alkylpyridinium salt, and an imidazolium salt.

(Amphoteric Surfactant)

Examples of the amphoteric surfactant include carboxybetaine, sulfobetaine, aminocarboxylate, and an imidazoline derivative.

(Nonionic Surfactant)

Examples of the nonionic surfactant include polyoxyethylene alkyl ethers, polyoxyethylene alkyl phenyl ethers, polyoxyethylene fatty acid esters, sorbitan fatty acid esters, polyoxyethylene sorbitan fatty acid esters, polyoxyethylene sorbitol fatty acid esters, glycerol fatty acid esters, polyoxyethylene glycerin fatty acid esters, polyglycerol fatty acid esters, sucrose fatty acid ester, polyoxyethylene alkylamine, polyoxyethylene fatty acid amides, alkyl alkanolamide, acetylene glycol, or a polyoxyethylene adduct of acetylene glycol. Alternatively, other examples of the nonionic surfactant include polyoxypropylene-based compounds among the exemplified compounds, in which the oxyethylene structure is an oxypropylene structure.

Among those, in terms of obtaining a more excellent effect of the present invention, a polyoxyalkylene type nonionic surfactant is preferable. Specific examples thereof include polyoxyalkylene alkyl ethers, polyoxyalkylene alkylphenyl ethers, polyoxyalkylene glycol fatty acid esters, polyoxyalkylene fatty acid esters, polyoxyalkylene sorbitan fatty acid esters, polyoxyalkylene fatty acid monoalkanolamides, and polyoxyalkylene fatty acid dialkanolamides. More specific examples thereof include surfactants in which an alkylene portion is ethylene or propylene.

(Anionic Surfactant)

The anionic surfactant is not particularly limited, and for example, those known in emulsification or washing areas can be used. The anionic surfactants can be roughly classified into a sulfate ester type, a phosphoric ester type, a carboxylic acid type, a sulfonic acid type, and the like, any of which may be used.

Specific examples of the sulfuric ester type anionic surfactants include polyoxyethylene styrenated phenyl ether sulfate (HITENOL NF-08, NF-0825, NF-13, or NF-17, a product of Dai-Ichi Kogyo Seiyaku Co., Ltd.), polyoxyalkylene decyl ether sulfate (HITENOL XJ-16 or XJ-630S, a product of Dai-Ichi Kogyo Seiyaku Co., Ltd.), polyoxyalkylene isodecyl ether sulfate (HITENOL PS-06 or PS-15, a product of Dai-Ichi Kogyo Seiyaku Co., Ltd.), polyoxyalkylene tridecyl ether sulfate (HITENOL 330T or TM-07, a product of Dai-Ichi Kogyo Seiyaku Co., Ltd.), polyoxyethylene lauryl ether sulfate (HITENOL 227L, 325L, LA-10, LA-12, or LA16, a product of Dai-Ichi Kogyo Seiyaku Ltd.), polyoxyethylene alkyl ether sulfate (HITENOL 325SM, a product of Dai-Ichi Kogyo Seiyaku Co., Ltd.), and polyoxyethylene oleyl cetyl ether sulfate (HITENOL 08E, 16E, or W-2320, a product of Dai-Ichi Kogyo Seiyaku Co., Ltd.). In addition, the sulfuric ester type anionic surfactants structure shown below can also be suitably used.

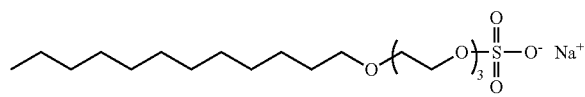

Specific examples of the phosphoric ester type anionic surfactant include a polyoxyethylene tridecyl ether phosphoric ester (PLYSURF A212C or A215C, a product of Dai-Ichi Kogyo Seiyaku Co., Ltd.), a polyoxyethylene styryl phenyl ether phosphoric ester (PLYSURF AL or AL12-H, a product of Dai-Ichi Kogyo Seiyaku Co., Ltd.), a polyoxyalkylene decyl ether phosphoric ester (PLYSURF A208F or A208N, a product of Kogyo Seiyaku Co., Ltd.), a polyoxyalkylene decyl ether phosphoric ester salt (PLYSURF M208F, a product of Dai-Ichi Kogyo Seiyaku Co., Ltd.), a polyoxyethylene lauryl ether phosphoric ester (PLYSURF A208B, A210B, or A219B, a product of Dai-Ichi Kogyo Seiyaku Co., Ltd.), a polyoxyethylene lauryl ether phosphoric ester salt (PLYSURF DB-01, a product of Dai-Ichi Kogyo Seiyaku Co., Ltd.), a polyoxyethylene alkyl ether phosphoric ester (PLYSURF A210D, a product of Dai-Ichi Kogyo Seiyaku Co., Ltd.), and an alkyl phosphoric ester salt (PLYSURF DBS or DOM, a product of Dai-Ichi Kogyo Seiyaku Co., Ltd.).

Specific examples of the carboxylic acid type anionic surfactant include a polyoxyethylene lauryl ether acetate salt (NEO-HITENOL ECL-30S or ECL-45, a product of Dai-Ichi Kogyo Seiyaku Co., Ltd.), lauryl sulfosuccinate (NEO-HITENOL LS, a product of Dai-Ichi Kogyo Seiyaku Co., Ltd.), polyoxyethylene lauryl sulfosuccinate (NEO-HITENOL L-30S, a product of Dai-Ichi Kogyo Seiyaku Co., Ltd.), polyoxyethylene alkyl sulfosuccinate (NEO-HITENOL S-70, a product of Dai-Ichi Kogyo Seiyaku Co., Ltd.), a higher fatty acid salt (KARI SEKKEN HY, a product of Dai-Ichi Kogyo Seiyaku Co., Ltd.), and naphthenate.

Specific examples of the sulfonic acid type anionic surfactant include a linear alkylbenzenesulfonate (NEOGEN S-20F or SC-F, a product of Dai-Ichi Kogyo Seiyaku Co., Ltd.), an alkylbenzenesulfonate (SAS-12F, a product of Dai-Ichi. Kogyo Seiyaku Co., Ltd.), an α-olefin sulfonate (NEOGEN AO-90, a product of Dai-Ichi Kogyo Seiyaku Co., Ltd.), a phenolsulfonic acid (NEOGEN PSA-C, a product of Dai-Ichi Kogyo Seiyaku Co., Ltd.), a dioctylsulfosuccinate (NEOCOL SW, SW-C, P, or YSK, a product of Dai-Ichi Kogyo Seiyaku Co., Ltd.), lauryl sulfate (MONOGEN Y-100 or Y-500T), an alkyl naphthalenesulfonate, and a naphthalenesulfonate.

Besides the above, as the anionic surfactant, formalin polycondensates, condensates of a higher fatty acid and an amino acid, acylated peptide, N-acylmethyltaurine, or the like can be used.

Furthermore, the cation of the anionic surfactant can be appropriately selected from $H^+$, $Na^+$, $K^+$, $Li^+$, $NH_4^+$, and ethanolamine.

Furthermore, the surfactant may typically contain metal impurities such as Na, K, and Fe in the amount of approximately 1 to several thousands ppm by mass in a commercially available form in some cases, and in this case, the surfactant serves as a source of metal contamination. Therefore, in the case where metal impurities are included in the surfactant, it is preferable to use the surfactant after purification such that the content of each of the metal impurities is usually 10 ppm or less, preferably 1 ppm or less, and more preferably 0.3 ppm or less. As the purification method, for example, a method in which a surfactant is dissolved in water and then passed through an ion-exchange resin to capture the metal impurities in the resin is suitable. By using the surfactant thus purified, it is possible to obtain a washing liquid having a highly reduced content of the metal impurities.

From the viewpoint of further improving the residue removing performance, it is more preferable that the corrosion inhibitor includes, among those above, at least one compound selected from 1H-1,2,3-triazole, benzotriazole, 1,2,4-triazole, 3-amino-1,2,4-triazole, the boronic acid represented by Formula (B), the metal chloride represented by Formula (C), or the anionic surfactant.

The content of the corrosion inhibitor in the treatment liquid is preferably 0.01% to 5% by mass, more preferably 0.05% to 5% by mass, and still more preferably 0.1% to 3% by mass, with respect to the total mass of the treatment liquid.

Furthermore, the corrosion inhibitor may be used singly or in combination of two or more kinds thereof. In the case where two or more kinds of the oxidizing agents are used in combination, the total content thereof is preferably within the range.

<Fe>

The present invention, Fe may be any form of ionic Fe and nonionic Fe (for example, Fe particles). That is, Fe means any of Fe atoms included in the treatment liquid.

As for the content of Fe in the treatment liquid, the content ratio of the Fe to the other components included in the treatment liquid, the method for measuring the content of Fe in the treatment liquid, and the like are as described above.

<Water>

The treatment liquid according to the embodiment of the present invention contains water.

The content of water in the treatment liquid according to the embodiment of the present invention is not particularly limited, and may be any one of 1% to 99.999% by mass with respect to the total mass of the treatment liquid. The content of water is preferably, for example, 1% to 98% by mass. From the viewpoint of further improving the anticorrosion property, the content of water is preferably 5% by mass or more.

Moreover, for the treatment liquid according to the embodiment of the present invention, the content of the water, and the content of the organic solvent that is any of solvents which will be described later can be adjusted to provide the liquid properties with any of a water-based formulation and an organic solvent-based formulation.

Incidentally, in the present specification, a treatment liquid in which the content of the water in the treatment liquid is larger than the content of the organic solvent is referred to as a "water-based treatment liquid", and a treatment liquid in which the content of the organic solvent in the treatment liquid is larger than the content of the water is also referred to as a "solvent-based treatment liquid". The composition of the water-based treatment liquid and the solvent-based treatment liquid in paragraphs which will be described in the later.

<Organic Solvent>

The treatment liquid according to the embodiment of the present invention may contain an organic solvent. By incorporation of the organic solvent, an anticorrosion effect is more improved.

As the organic solvent, any of known organic solvents can be used, and a hydrophilic organic solvent is preferable. The hydrophilic organic solvent means an organic solvent that can be uniformly mixed with water at any ratio.

Specific examples of the hydrophilic organic solvent include a water-soluble alcohol-based solvent, a water-soluble ketone-based solvent, a water-soluble ester-based solvent, a water-soluble ether-based solvent (for example, glycol diether), a sulfone-based solvent, a sulfonic acid-based solvent, a sulfoxide-based solvent, a nitrile-based solvent, and an amide-based solvent, and in order to obtain desired effects, any of those solvents can be used.

Examples of the water-soluble alcohol-based solvent include an alkanediol (including, for example, alkylene glycol), an alkoxyalcohol (including, for example, glycol monoether), a saturated aliphatic monohydric alcohol, an unsaturated non-aromatic monohydric alcohol, and a low-molecular-weight alcohol including a ring structure.

Examples of the alkanediol include glycol, 2-methyl-1,3-propanediol, 1,3-propanediol, 2,2-dimethyl-1,3-diol, 1,4-butanediol, 1,3-butanediol, 1,2-butanediol, 2,3-butanediol, pinacol, and alkylene glycol.

Examples of the alkylene glycol include ethylene glycol, propylene glycol, diethylene glycol, dipropylene glycol, triethylene glycol, and tetraethylene glycol.

Examples of the alkoxy alcohol include 3-methoxy-3-methyl-1-butanol 3-methoxy-1-butanol, 1-methoxy-2-butanol, and glycol monoether.

Examples of the glycol monoether include ethylene glycol monomethyl ether, ethylene glycol monoethyl ether, ethylene glycol mono-n-propyl ether, ethylene glycol monoisopropyl ether, ethylene glycol mono-n-butyl ether, diethylene glycol monomethyl ether, diethylene glycol monoethyl ether, diethylene glycol monobutyl ether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

Examples of the saturated aliphatic monohydric alcohol include methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

Examples of the unsaturated non-aromatic monohydric alcohol include allyl alcohol, propargyl alcohol, 2-butenyl alcohol, 3-butenyl alcohol, and 4-penten-2-ol.

Examples of the low-molecular-weight alcohol including a ring structure include tetrahydrofurfuryl alcohol, furfuryl alcohol, and 1,3-cyclopentanediol.

Examples of the water-soluble ketone-based solvent include acetone, propanone, cyclobutanone, cyclopentanone, cyclohexanone, diacetone alcohol, 2-butanone, 5-hexanedione, 1,4-cyclohexanedione, 3-hydroxyacetophenone, and 1,3-cyclohexanedione.

Examples of the water-soluble ester-based solvent include ethyl acetate, glycol monoesters such as ethylene glycol monoacetate and diethyleneglycol monoacetate, and glycol monoether monoesters such as propylene glycol monomethyl ether acetate, ethylene glycol monomethyl ether acetate, propylene glycol monoethyl ether acetate, and ethylene glycol monoethyl ether acetate.

Among those, ethylene glycol monobutyl ether, tri(propylene glycol) methyl ether, and diethylene glycol monoethyl ether are preferable.

Examples of the sulfone-based solvent include sulfolane, 3-methyl sulfolane, and 2,4-dimethyl sulfolane.

Examples of the sulfoxide-based solvent include dimethyl sulfoxide.

Examples of the nitrile-based solvent include acetonitrile.

Examples of the amide-based solvent include N,N-dimethylformamide, 1-methyl-2-pyrrolidone, 2-pyrrolidinone, 1,3-dimethyl-2-imidazolidinone, ε-caprolactam, formamide, N-methylformamide, acetamide, N-methylacetamide, N,N-dimethylacetamide, N-methylpropaneamide, and hexamethylphosphoric triamide.

As the sulfonic acid-based solvent, an organic sulfonic acid-based solvent is preferable, and examples thereof include methanesulfonic acid.

Among the hydrophilic organic solvents, from the viewpoint of further improving the anticorrosion effect, the water-soluble alcohol-based solvent, the sulfone-based solvent, the amide-based solvent, the solfonic acid-based solvent, or the sulfoxide-based solvent is preferable, the water-soluble alcohol-based solvent, the sulfonic acid-based solvent, or the sulfoxide-based solvent is more preferable, and the sulfonic acid-based solvent is still more preferable.

The content of the organic solvent is not particularly limited.

The organic solvent may be used singly or in combination of two or more kinds thereof, in the case where two or more kinds of the organic solvents are used in combination, the total amount thereof is preferably within the above-mentioned range.

(Water-Based Treatment Liquid)

In the case of using the water-based treatment liquid, it is preferable that the content of the water is 20% to 98% by mass with respect to the total mass of the treatment liquid, and the content of the organic solvent is 1% to 40% by mass with respect to the total mass of the treatment liquid.

In the case of using the water-based treatment liquid, the content of the water is preferably 35% to 98% by mass, and more preferably 50% to 95% by mass.

In the case of using the water-based treatment liquid, the content of the organic solvent is preferably 5% to 35% by mass, and more preferably 10% to 30% by mass, with respect to the total mass of the treatment liquid.

(Solvent-Based Treatment Liquid)

In the case of using the solvent-based treatment liquid, it is preferable that the content of the water is 1% to 40% by mass with respect to the total mass of the treatment liquid and the content of the organic solvent is 20% to 98% by mass with respect to the total mass of the treatment liquid.

In the case of using the solvent-based treatment liquid, the content of the water is preferably 2% to 25% by mass, and from the viewpoint of further improving the residue removing properly, it is more preferably 12% to 25% by mass, with respect to the total mass of the treatment liquid.

In the case of using the solvent-based treatment liquid, the content of the organic solvent is preferably 40% to 98% by mass, more preferably 45% to 98% by mass, and still more preferably 50% to 95% by mass, with respect to the total mass of the treatment liquid.

<Other Additives>

The treatment liquid according to the embodiment of the present invention may contain other additives in addition to the above-mentioned components. Examples of such other additives include a halide and a polyfunctional organic acid.

(Halide)

The treatment liquid according to the embodiment of the present invention preferably further contains a halide. By incorporation of the halide into the treatment liquid, a residue removing property is improved in the production of a semiconductor device.

The halide is a compound which has a halogen atom and an atom having a smaller electronegativity than that of the halogen atom. Examples of the halogen atom include a fluorine atom, a chlorine atom, a bromine atom, and an iodine atom.

The halide is not particularly limited, and examples thereof include hydrofluoric acid (HF), hydrochloric acid (HCl), hydrobromic acid (HBr), hydroiodic acid (HI), fluorosilicic acid ($H_2SiF_6$), fluoroboric acid, an ammonium fluorosilicate salt (($NH_4)_2SiF_6$), tetramethylammonium hexafluorophosphate, ammonium fluoride, an ammonium fluoride salt, an ammonium bifluoride salt, quaternary ammonium tetrafluoroborate (for example, tetramethylammonium tetrafluoroborate, tetraethylammonium tetrafluoroborate, tetrapropylammonium tetrafluoroborate, and tetrabutylammonium tetrafluoroborate), and quaternary phosphonium tetrafluoroborate (for example, tetrabutylphosphonium tetrafluoroborate).

Among those, from the viewpoint of further improving the residue removing properly, hydrofluoric acid (HF), hydrochloric acid (HCl), hydrobromic acid (HBr), or hydroiodic acid (HI) is preferable, and hydrofluoric acid (HF) is more preferable.

In the case where the halide is contained, the content thereof is preferably 0.01% to 30% by mass, more preferably 0.1% to 15% by mass, and still more preferably 0.1% to 5% by mass, with respect to the total mass of the treatment liquid.

In addition, the halide may be used singly or in combination of two or more kinds thereof. In the case where two or more kinds of the halides are used in combination, the total content thereof is preferably within the range.

(Polyfunctional Organic Acid)

The polyfunctional organic acid means an acid having two or more acid groups, which can function as a chelate ligand. The polyfunctional organic acid not only forms a complex salt with a Fe ion included in a treatment liquid, but also forms a complex salt with an oxidized metal included in a residue. As a result, by incorporation of the polyfunctional organic acid, adhesion of the Fe ion onto a substrate is further suppressed, and also the recyclability of the treatment liquid is also improved.

The polyfunctional organic acid is not particularly limited, and is preferably a polyaminopolycarboxylic acid.

The polyaminopolycarboxylic acid is a compound having a plurality of amino groups and a plurality of carboxylic acid groups, and examples thereof include a mono- or polyalkylenepolyamine polycarboxylic acid, a polyaminoalkane polycarboxylic acid, a polyaminoalkanol polycarboxylic acid, and a hydroxyalkyl ether polyamine polycarboxylic acid.

Suitable examples of the polyaminopolycarboxylic acid include butylenediaminetetraacetic acid, diethylenetriaminepentaacetic acid (DTPA), ethylenediaminetetrapropionic acid, triethylenetetraaminehexaacetic acid, 1,3-diamino-2-hydroxypropane-N,N,N',N'-tetraacetic acid, propylenediaminetetraacetic acid, ethylenediaminetetraacetic acid (EDTA), trans-1,2-diaminocyclohexanetetraacetic acid, ethylenediaminediacetic acid, ethylenediaminedipropionic acid, 1,6-hexamethylene-diamine-N,N,N',N'-tetraacetic acid, N,N-bis(2-hydroxybenzyl)ethylenediamine-N,N-diacetic acid, diaminopropanetetraacetic acid, 1,4,7,10-tetraazacyclododecane-tetraacetic acid, diaminopropanoltetraacetic acid, and (hydroxyethyl)ethylenediaminetriacetic acid. Among those, diethylenetriamine pentaacetic acid (DTPA), ethylenediamine tetraacetic acid (EDTA), or trans-1,2-diaminocyclohexane tetraacetic acid is preferable.

In addition to those, preferred examples of the polyfunctional organic acid include aliphatic dicarboxylic acids such as oxalic acid, malonic acid, succinic acid, and maleic acid, as well as aliphatic polycarboxylic acids including a hydroxyl group, such as malic acid, tartaric acid, and citric acid.

In the case where the treatment liquid contains a polyfunctional organic acid, the content of the polyfunctional organic acid is preferably 0.01% to 5% by mass, and more preferably 0.01% to 3% by mass, with respect to the total mass of the treatment liquid.

In addition, the polyfunctional organic acid may be used singly or in combination of two or more kinds thereof. In the case where two or more kinds of the polyfunctional organic acids are used in combination, the total content thereof is preferably within the range.

(Thickener)

The treatment liquid according to the embodiment of the present invention may contain a thickener. By incorporation of the thickener, the viscosity of the treatment liquid can be controlled, and the in-plane uniformity in the treatment can be adjusted.

Examples of the thickener for use in the treatment liquid according to the embodiment of the present invention include a water-soluble polymer which is dissolved in water, for example, plant-based polysaccharides such as guar gum, locust bean gum, starch, arabic gum, tragacanth gum, carrageenan, and alginic acid, animal-based polymer substances from microorganisms, such as xanthan gum and gellan gum, starch derivatives such as carboxymethylated starch and cationic starch, cellulose derivatives such as carboxymethyl cellulose and hydroxypropylmethyl cellulose, hydroxyethyl guar gum, cationic guar gum derivatives, alginic acid derivatives such as propylene glycol alginate, and synthetic polymer compounds such as polyvinyl alcohol, polyvinyl pyrrolidone, polyacrylic esters, polyacrylamides, and polyethylene oxide.

Among those, the xanthan gum or the carboxymethyl cellulose having excellent acid resistance is preferable. The content of these thickeners is preferably 0.1% to 10% by mass, more preferably 0.3% to 7% by mass, and still more preferably 0.5% to 5% by mass, with respect to the total mass of the treatment liquid.

Incidentally, the thickener may be used singly or in combination of two or more kinds thereof. In the case where two or more kinds of the thickeners are used in combination, the total content thereof is preferably within the range.

<pH Adjuster>

The treatment liquid according to the embodiment of the present invention may contain a pH adjuster.

As the pH adjuster, known pH adjusters can be used. In general, a pH adjuster not including a metal ion is preferable, and examples thereof include ammonium hydroxide, monoamines, imines (for example, 1,8-diazabicyclo[5.4.0]undeca-7-ene, 1,5-diazabicyclo[4.3.0]non-5-ene), 1,4-diazabicyclo[2.2.2]octane, and guanidine salts (for example, guanidine carbonate), any of which can be used in order to obtain desired effects. Among those, ammonium hydroxide or imines (for example, 1,8-diazabicyclo[5.4.0]undeca-7-ene or 1,5-diazabicyclo[4.3.0]non-5-ene) is preferable.

The pH adjuster may be used singly or in appropriate combination of two or more kinds thereof.

(Other Additives)

In addition, examples of such other additives include a defoamer, a rust inhibitor, and a preservative, in addition to the above-mentioned surfactant.

<Coarse Particles>

It is preferable that the treatment liquid according to the embodiment of the present invention substantially does not include coarse particles.

The coarse particles refer to particles having a diameter of 0.2 μm or more, for example, in the case of considering the shapes of the particles as spheres. Further, the expression, substantially not including coarse particles, indicates that the number of particles in 0.2 μm or more in 1 mL of the treatment liquid in the case where measurement of the treatment liquid using a commercially available measuring device in a light scattering type in-liquid particle measurement system is carried out is 10 or less.

Furthermore, the coarse particles included in the treatment liquid are particles of dusts, organic solids, inorganic solids, or the like which are included as impurities in raw materials, or particles of dusts, organic solids, inorganic solids, or the like which are incorporated as a contaminant during the preparation of a treatment liquid, and correspond to the particles which are not ultimately dissolved in the treatment liquid and present as particles.

The amount of the coarse particles present in the treatment liquid can be measured in a liquid phase using a commercially available measuring device in a light scattering type in-liquid particle measurement system with a laser as a light source.

Examples of a method for removing the coarse particles include a treatment such as filtering which will be described later.

<Physical Properties or the Like of Treatment Liquid>

The pH of the treatment liquid according to the embodiment of the present invention is preferably in the range of −3.0 to 5.0. By adjusting the pH of the treatment liquid to be in such an acidic region as described, the defect suppressing performance is more excellent.

The lower limit value of the pH of the treatment liquid is preferably −2 or more, and more preferably −1 or more, from the viewpoint of exhibiting more excellent defect suppressing performance.

The upper limit value of the pH of the treatment liquid is preferably 4 or less, and more preferably 3 or less, from the viewpoint that the anticorrosion property of the metal layer is more excellent and the number of detects does not increase.

The pH of the treatment liquid can be measured using a known pH meter.

(Viscosity)

For the treatment liquid according to the embodiment of the present invention, in the case where the viscosity of the treatment liquid according to the embodiment of the present invention at 25° C. is measured using a rotational viscometer, the ratio (viscosity B/viscosity A) of the viscosity of the treatment liquid at a rotation speed of 100 rpm (viscosity B) to the viscosity of the treatment liquid at a rotation speed of 1,000 rpm (viscosity A) is preferably 1 to 20, more preferably 1.0 to 5.0, and still more preferably 1.0 to 2.0, By setting the viscosity ratio to 1 or more, the etching performance is stabilized, whereas by setting the viscosity ratio to 20 or less, the robustness for a method of applying the treatment liquid or a treatment condition is excellent.

The viscosity of the treatment liquid is measured, for example, using a rotational viscometer (for example, trade name, "Precision Rotational Viscometer RST-CC" (manufactured by Brookfield)).

<Applications>

The treatment liquid according to the embodiment of the present invention is a treatment liquid for a semiconductor device. In the present invention, the expression, "for a semiconductor device" means a use in the manufacture of a semiconductor device. The treatment liquid according to the embodiment of the present invention can also be used in any steps for manufacturing a semiconductor device, and can be used in treatments of, for example, an insulating film, a resist, etching residues, an antireflection film, ashing residues, or the like which are present on a substrate.

As for more specific applications of the treatment liquid, the treatment liquid is used as a pre-wet liquid applied on a substrate in order to improve the coatability of an actinic ray-sensitive or radiation-sensitive composition before a step of forming a resist film using the composition; a washing liquid used for the removal of residues such as an etching residue; a solution (for example, a removing liquid and a peeling liquid) used for the removal of various resist films for pattern formation; and a solution (for example, a removing liquid and a peeling liquid) used for the removal of a permanent film (for example, a color filter, a transparent insulating film, and a resin-made lens) or the like from a semiconductor substrate; or the like. Further, the treatment liquid can also be used as a developer for various resists for pattern formation. In addition, the semiconductor substrate after the removal of the permanent film may be employed again in a use of a semiconductor device in some cases, and therefore, the removal of the permanent film is included in the step of manufacturing a semiconductor device.

The treatment liquid according to the embodiment of the present invention may be used in only one or two or more of the applications.

As miniaturization and high functionalization of semiconductor devices proceed in recent years, metals used for wiring materials, plug materials, or the like are required to be more electrically conductive. For example, it is predicted that substitution of aluminum (Al) and copper (Cu) in the metals used as the wiring material with cobalt (Co) proceeds. Further, for a metal used as a plug material, it is also expected that a need of Co further increases, in addition to tungsten (W).

As a result, as characteristics of the treatment liquid, less corrosion with W and Co is required, and in particular, less corrosion with Co is required. On the other hand, the treatment liquid is simultaneously required to have an anticorrosion property with a layer including any one selected from $SiO_x$, SiOC, or SiN used as an insulating layer or the like.

It is preferable that the treatment liquid according to the embodiment of the present invention is used as a treatment liquid which has an excellent anticorrosion property with respect to W, Co, $SiO_x$, SiOC, or SiN, and is used for manufacturing a semiconductor device including a substrate comprising a metal layer including W, a substrate comprising a metal layer including Co, or an insulating layer including any one selected from $SiO_x$, SiOC, or SiN.

[Method for Producing Treatment Liquid]
<Liquid Preparing Method for Treatment Liquid>

The treatment liquid can be produced by a known method.

Hereinafter, a method for producing the treatment liquid will be described in detail.

(Step of Purifying Raw Materials)

In the production of the treatment liquid, it is preferable to purify any one or more of raw materials for preparing a treatment liquid in advance by distillation, ion exchange, filtering, or the like in order to reduce the content of Fe in the liquid. The degree of purification is, for example, preferably 99% or more of a purity of the raw material, and more preferably 99.9% or more of a purity of the raw material. It is preferable to use such a high-purity raw material in order to obtain noticeable effects by the present invention.

The purification method is not particularly limited, and examples thereof include a method of passing raw materials through an ion-exchange resin, a reverse osmosis membrane (RO membrane), or the like, and a method of performing distillation or filtering which will be described later. Specific examples of the method include a method of carrying out a primary purification by passing a liquid through a reverse osmosis membrane or the like, and then carrying out a secondary purification by passing a liquid through a purification device including a cation-exchange resin, an anion-exchange resin, or a mixed-bed type ion-exchange resin.

Furthermore, the purification treatment may be carried out by combination of a plurality of the above-mentioned known purification methods.

In addition, the purification treatment may be carried out in a plurality of times.

(Filtering)

As a filter, any filter which has been used in the filtering applications or the like in the related art can be used without particular limitation. Examples thereof constituting the filter include filters formed of fluorine resins such as polytetrafluoroethylene (PTFE) and a tetrafluoroethylene perfluoroalkylvinyl ether copolymer (PFA), polyamide-based resins such as nylon, polyolefin resins (including a high-density polyolefin and an ultrahigh-molecular-weight polyolefin) such as polyethylene and polypropylene (PP), or the like. Among these materials, a material selected from the group consisting of polyethylene, polypropylene (including high-density polypropylene), the fluorine resins such as PTFE and PFA, and the polyamide-based resins such as nylon is preferable, and among these, filters formed of the fluorine resins such as PTFE and PFA are more preferable. By using a filter formed with these materials, high-polarity foreign matters which are likely to cause defects can be effectively removed, and in addition, the content of Fe can be more efficiently reduced.

The critical surface tension of the filter is preferably 70 mN/m or more, more preferably 95 mN/m or less, and still more preferably from 75 mN/m to 85 mN/m. In addition, the value of the critical surface tension is a nominal value of a manufacturer. By using a filter having a critical surface tension in the range, high-polarity foreign matters which are likely to cause detects can be effectively removed, and in addition, the content of Fe can be more efficiently reduced.

The pore diameter of the filter is preferably approximately 2 to 20 nm, and more preferably 2 to 15 nm. By adjusting the pore diameter of the filter to the range, fine foreign matters such as impurities and aggregates included in the raw material can be reliably removed, while suppressing clogging in filtering, and in addition, the content of Fe can be efficiently reduced.

In the case of using filters, different filters may be combined. At that time, the filtering with the first filter may be performed once or twice or more times. In the case where the filtering is performed twice or more times by combining different filters, the pore diameter at the second filtering or later is preferably the same as or smaller than the pore diameter of the filter at the first filtering. In addition, the first filters with different pore diameters in the above-mentioned range may be combined. Here, with regard to the pore diameters, reference can be made to nominal values of filter manufacturers. A commercially available filter may be selected from various filters provided by Nihon Pall Ltd., Advantech Toyo Roshi Kaisha., Ltd., Nihon Entegris K. K. (formerly Nippon Microlith Co., Ltd.), Kitz Micro Filter Corporation, or the like, for example. Further, a polyamide-made "P-Nylon Filter (a pore diameter of 0.02 μm and a critical surface tension of 77 mN/m)" (manufactured by Nihon Pall Ltd.), a high-density polyethylene-made "PE-Clean Filter (a pore diameter of 0.02 μm)" (manufactured by Nihon Pall Ltd.), and a high-density polyethylene-made "PE-Clean Filter (a pore diameter of 0.01 μm)" (manufactured by Nihon Pall Ltd.) can also be used.

As the second filter, a filter formed of the same materials as those of the first filter, and the like can be used. The pore diameter of the second filter is preferably approximately 1 to 10 nm.

Moreover, in the present invention, the filtering step is preferably performed at room temperature (25° C.) or lower, more preferably performed at 23° C. or lower, and still more preferably performed at 20° C. or lower. Further, the filtering step is preferably performed at 0° C. or higher, more preferably performed at 5° C. or higher, and still more preferably performed at 10° C. or higher.

In the filtering step, particulate foreign matters or impurities can be removed, but in the case of performing the filtering step at the temperature, the amounts of the particulate foreign matters and/or impurities dissolved in the raw material are reduced, and therefore, the particulate foreign matters and/or impurities are more efficiently removed by filtering.

Moreover, the filter used is preferably treated before filtering the raw material. The liquid used in this treatment is not particularly limited, and the content of Fe is preferably less than 0.001 ppt by mass. Examples of the liquid include a liquid having a content of Fe set within the range by purifying other organic solvents in addition to the above-mentioned water. By pretreating the filter with a liquid having a reduced content of Fe as described above, the content of Fe can be efficiently reduced.

(Liquid Preparing Step)

The liquid preparation for the treatment liquid according to the embodiment of the present invention is not particularly limited, and examples thereof include production by mixing the above-mentioned respective components. The procedure and/or timing for mixing the above-mentioned respective components is not particularly limited, and examples thereof include a method in which an oxidizing agent is dispersed in advance in water having a pH adjusted, and predetermined components are mixed in order.

In addition, the prepared treatment liquid may be subjected to adjustment of the content of Fe, as desired, by performing a purification treatment such as filtering as described above.

<Kit and Concentrate>

The treatment liquid in the present invention may be used in the form of a kit having raw materials divided into a plurality of parts.

Although not being particularly limited, examples of a specific method for using the treatment liquid in the form of the kit include an aspect in which a liquid composition containing an oxidizing agent in water is prepared as a first liquid, and a liquid composition containing a corrosion inhibitor in an organic solvent as a second liquid is prepared.

In addition, the treatment liquid may be prepared as a concentrate. In this case, it can be used after being diluted with water and/or an organic solvent at the time of use.

<Container (Housing Container)>

The treatment liquid according to the embodiment of the present invention can be filled in any container as long as the container does not have any problem such as corrosion properties (irrespective of whether the treatment liquid is a kit or a concentrate), transported, and used. As for the container, as a container used in semiconductor applications, a container which has high cleanliness in the container and less elution of impurities is preferable. Examples of the usable container include, but are not limited to, "CLEAN BOTTLE" series (manufactured by Aicello Chemical Co., Ltd.) and "PURE BOTTLE" (manufactured by Kodama Plastics Co., Ltd.). The inner wall of the container is preferably formed of one or more resins selected from the group consisting of a polyethylene resin, a polypropylene resin, and a polyethylene-polypropylene resin, other resins, or a metal which has been antirust and metal elution preventing treatments, such as stainless steel, Hastelloy, Inconel, and Monel.

As such other resins, a fluorine-based resin (perfluoro resin) can be preferably used. In this manner, by using a container having an inner wall formed of a fluorine-based resin, elution of ethylene or propylene oligomers can be suppressed, as compared with the case of using a container having an inner wall formed of a polyethylene resin, a polypropylene resin, or a polyethylene-polypropylene resin.

Specific examples of such a container having an inner wall which is a fluorine-based resin include a Fluoro-PurePFA composite drum manufactured by Entegris Inc. Further, the containers described in page 4 and the like of JP1991-502677A (JP-H03-502677A), page 3 and the like of WO 2004/016526A, pages 9 and 16 of WO99/046309A, or the like can also be used.

Moreover, for the inner wall of the container, the quartz and the electropolished metal material (that is, the metal material which has been completely electropolished) are also preferably used, in addition to the above-mentioned fluorine-based resin.

The metal material used in the production of the electropolished metal material is preferably a metal material which contains at least one selected from the group consisting of chromium and nickel, and has a total content of chromium and nickel of more than 25% by mass with respect to the total mass of the metal material. Examples of the metal material include stainless steel and a nickel-chromium alloy.

The total content of chromium and nickel in the metal material is preferably 25% by mass or more, and more preferably 30% by mass or more, with respect to the total mass of the metal material.

In addition, the upper limit value of the total content of chromium and nickel in the metal material is not particularly limited, and in general, it is preferably 90% by mass or less.

The stainless steel is not particularly limited, and known stainless steel can be used. Among those, an alloy containing 8% by mass or more of nickel is preferable, and austenitic stainless steel containing 8% by mass or more of nickel is more preferable. Examples of the austenitic stainless steel include Steel Use Stainless (SUS) 304 (Ni content of 8% by mass, Cr content of 18% by mass), SUS 304L (Ni content of 9% by mass, Cr content of 18% by mass), SUS 316 (Ni content of 10% by mass, Cr content of 16% by mass and SUS 316L (Ni content of 12% by mass, Cr content of 16% by mass).

The nickel-chromium alloy is not particularly limited and a known nickel-chromium alloy can be used. Among those, a nickel-chromium alloy having a nickel content of 40% to 75% by mass and a chromium content of 1% to 30% by mass is preferable.

Examples of the nickel-chromium alloy include Hastelloy (trade name, hereinafter, the same shall apply), Monel (trade name, hereinafter, the same shall apply), and Inconel (trade name, hereinafter, the same shall apply). More specific examples thereof include Hastelloy C-276 (Ni content of 63% by mass, Cr content of 16% by mass), Hastelloy C (Ni content of 60% by mass, Cr content of 17% by mass), and Hastelloy C-22 (Ni content of 61% by mass, Cr content of 22% by mass).

In addition, the nickel-chromium alloy may further contain boron, silicon, tungsten, molybdenum, copper, cobalt, or the like, as desired, in addition to the above-mentioned alloys.

The method of electropolishing the metal material is not particularly limited, and known methods can be used. For example, the methods described in paragraphs <0011> to <0014> of JP2015-227501A, paragraphs <0036> to <0042> of JP2008-264929A, or the like can be used.

It is presumed that the metal material has a larger content of chromium in the passivation layer on the surface than the content of chromium in the parent phase by electropolishing the metal material. As a result, it is presumed that since it is difficult for the metal elements to flow into the treatment liquid from the inner wall coated with the electropolished metal material, it is possible to obtain semiconductor chemicals having a reduced specific metal element.

In addition, it is preferable that the metal material is buffed. The buffing method is not particularly limited, and known methods can be used. The size of the abrasive grain used to finish the buffing is not particularly limited, and is preferably #400 or less in view that the unevenness of the surface of the metal material is likely to be smaller.

Incidentally, buffing is preferably performed before the electropolishing.

In addition, the metal material may be subjected to a treatment including one of or a combination of two or more of buffing, acid washing, magnetic fluid polishing, and the like in a plurality of steps that are performed by changing the number of a size or the like of the abrasive grains.

In the present invention, a body having the container and the treatment liquid contained in this container may be referred to as a treatment liquid housing body in some cases.

For such a container, it is preferable to wash the inside of the container before filling. For the liquid used for the washing, it is preferable that the content of Fe in the liquid is reduced. The liquid may be appropriately selected depending on the application, but as long as the liquid is a liquid having a reduced content of Fe by purifying other organic solvents; the treatment liquid according to the embodiment of the present invention as it is; a dilution of the treatment liquid according to the embodiment of the present invention; or a liquid including at least one of the components added to the treatment liquid according to the embodiment of the present invention, the effects of the present invention are noticeably obtained. The treatment liquid according to the embodiment of the present invention may be battled in a container such as a gallon bottle and a quart bottle after the production, transported, and stored.

In order to prevent the modifications in the components in the treatment liquid during the storage, the inside of the container may be purged with inert gas (nitrogen, argon, or the like) with a purity of 99.99995% by volume or more. In particular, a gas having a low moisture content is preferable. In addition, during the transportation or storage, the temperature may be controlled to a normal temperature in the range of −20° C. to 20° C. to prevent deterioration.

(Clean Room)

It is preferable that handlings including production of the treatment liquid according to the embodiment of the present invention, opening and/or washing of a housing container, filling of the treatment liquid, and the like, treatment analysis, and measurements are all performed in clean rooms. The clean rooms preferably satisfy 14644-1 clean room standards. It is preferable to satisfy any one of International Standards Organization (ISO) Class 1, ISO Class 2, ISO Class 3, or ISO Class 4, it is more preferable to satisfy either ISO Class 1 or ISO Class 2, and it is still more preferable to satisfy ISO Class 1.

[Method for Washing Substrate]

The method for washing a substrate according to an embodiment of the present invention has a washing step B of washing a substrate comprising a metal layer including Co using the treatment liquid. Further, the method for washing a substrate according to the embodiment of the present invention may have a treatment liquid preparing step A of preparing the treatment liquid before the washing step B.

In the following description of the method for washing a substrate, the case where the treatment liquid preparing step A is carried out before the washing step B is presented by way of an example, but is not restrictive, and the method for washing a substrate according to the embodiment of the present invention may be performed using the treatment liquid that has been prepared in advance.

<Washing Target>

As long as the washing target of the method for washing a substrate according to the embodiment of the present invention is a substrate comprising a metal layer including Co, it is not particularly limited, and examples thereof include a laminate comprising at least the metal layer including Co (hereinafter simply referred to as a "metal layer"), an interlayer insulating film, and a metal hard mask in this order on a substrate. The laminate may have holes formed toward the substrate from the surface (apertures) of the metal hard mask so as to expose the surface of the metal layer through a dry etching step or the like.

A method for producing a laminate having holes as described above is not particularly limited, and common examples thereof include a method in which a laminate before the treatment, having a substrate, a metal layer, an interlayer insulating layer, and a metal hard mask in this order, is subjected to a dry etching step using the metal hard mask as a mask, and the interlayer insulating layer is etched so as to expose the surface of the metal layer to provide holes passing through the inside of the metal hard mask and the interlayer insulating layer.

Furthermore, a method for producing the metal hard mask is not particularly limited, and examples thereof include a method in which a metal layer including predetermined components is firstly formed on an interlayer insulating layer, a resist film having a predetermined pattern is formed thereon, and then the metal layer is etched using the resist film as a mask to produce a metal hard mask (that is, a film with a metal layer that is patterned).

In addition, the laminate may have layers other than the above-mentioned layer, and examples of such other layers include an etching stop film and an antireflection layer.

FIG. 1 illustrates a schematic cross-sectional view showing an example of a laminate which is a washing target in the method for washing a substrate according to the embodiment of the present invention.

A laminate 10 shown in FIG. 1 comprises a metal layer 2, an etching stop layer 3, an interlayer insulating layer 4, and a metal hard mask 5 in this order on a substrate 1, and has holes 6 formed by a dry etching step, through which the metal layer 2 is exposed at predetermined positions. That is, the washing target shown in FIG. 1 is a laminate comprising the substrate 1, the metal layer 2, the etching stop layer 3, the interlayer insulating layer 4, and the metal hard mask 5 in this order, and comprising the holes 6 passing through the surface of the metal hard mask 5 at aperture positions thereof to the surfaces of the metal layer 2. The inner wall 11 of the hole 6 is formed of a cross-sectional wall 11a including the etching stop layer 3, the interlayer insulating layer 4, and the metal hard mask 5, and a bottom wall 11b including the exposed metal layer 2, and dry etching residues 12 adhere thereto.

The method for washing a substrate according to the embodiment of the present invention can be suitably used in a washing intended to remove the dry etching residues 12. That is, the performance for removing the dry etching residues 12 is excellent, and the anticorrosion property for the inner wall 11 (for example, the metal layer 2) of the washing target is also excellent.

In addition, the method for washing a substrate according to the embodiment of the present invention may also be carried out for the laminate which has been subjected to a dry ashing step after the dry etching step.

Hereinafter, the respective layer constituent materials of the above-mentioned laminate will be described.

(Metal Hard Mask)

It is preferable that the metal hard mask contains at least one component selected from the group consisting of Cu, Co, W, $AlO_x$, AlN, $AlO_xN_y$, $WO_x$, Ti, TiN, $ZrO_x$, $HfO_x$, and $TaO_x$. Here, x and y each represent numbers represented by x=1 to 3 and y=1 to 2.

Examples of the materials of the metal hard mask include TiN, $WO_2$, and $ZrO_2$.

(Interlayer Insulating Layer)

A material for the interlayer insulating layer is not particularly limited, and examples thereof include a material, preferably having a dielectric constant k of 3.0 or less, and more preferably having a dielectric constant k of 2.6 or less.

Specific examples of the material for the interlayer insulating layer include $SiO_2$— and SiOC-based materials, and organic polymers such as a polyimide.

(Etching Stop Layer)

A material for the etching stop layer is not particularly limited. Specific examples of the material for the etching stop layer include SiN-, SiON-, and SiOCN-based materials, and metal oxides such as $AlO_x$.

(Metal Layer)

A wiring material forming the metal layer contains at least cobalt (Co). Incidentally, Co may be an alloy with another metal.

The wiring material may further contain metals other than Co, a metal nitride, or an alloy. Specific examples thereof include copper, titanium, titanium-tungsten, titanium nitride, tungsten, tantalum, tantalum compounds, chromium, chromium oxide, and aluminum.

(Substrate)

A term "substrate" as mentioned herein includes, for example, a semiconductor substrate including a single layer, and examples thereof include a semiconductor substrate including multiple layers.

A material constituting the semiconductor substrate formed of a single layer is not particularly limited, and in general, the semiconductor substrate is preferably formed of silicon, silicon germanium, Group III to V compounds such as GaAs, and any combinations thereof.

In the case of a semiconductor substrate including multiple layers, its configuration is not particularly limited, and the substrate may have, for example, exposed integrated circuit structures such as interconnect structures (interconnect features) such as a metal wire and a dielectric material on the semiconductor substrate such as silicon as described above. Examples of the metals and the alloys used in the interconnect structures include, but are not limited to, aluminum, aluminum alloyed with copper, copper, titanium, tantalum, cobalt, silicon, titanium nitride, tantalum nitride, and tungsten. Further, there may be an interlayer dielectric layer, a silicon oxide layer, a silicon nitride layer, a silicon carbide layer, a carbon-doped silicon oxide layer, or the like on the semiconductor substrate.

Hereinafter, the treatment liquid preparing step A and the washing step B will be described, respectively, in detail.

(Treatment Liquid Preparing Step A)

The treatment liquid preparing step A is a step of preparing the treatment liquid. The respective components used in the present step are as described above.

The procedure in the present step is not particularly limited, and examples thereof include a method in which an oxidizing agent, a corrosion inhibitor, and the other optional components are added to water and an organic solvent which is an optional component, and the mixture is stirred and mixed to prepare a treatment liquid. Further, in the case where the respective components are added to water and the organic solvent which is an optional component, they may be added at once or may be added in portions over a plurality of times.

In addition, it is preferable that as the respective components included in the treatment liquid, those classified into a semiconductor grade or those classified into a high-purity grade equivalent thereto are used, and those obtained by performing removal of foreign matters by filtering and/or reduction in ion components with ion-exchange resins or the like are used. In addition, it is also preferable that after mixing the raw material components, removal of foreign matters by filtering and/or reduction in ion components with ion-exchange resins or the like is performed.

(Washing Step B)

Examples of a washing target to be washed in the washing step B include the above-mentioned laminate, and examples thereof include the laminate 10 having holes formed by carrying out a dry etching step as described above (see FIG. 1). Further, the dry etching residues 12 adhere to the inside of the holes 6 in the laminate 10.

In addition, the laminate which has been subjected to a dry ashing step after the dry etching step may be used as a washing target.

A method for bringing the treatment liquid into contact with the washing target is not particularly limited, and examples thereof include a method in which a washing target is immersed in a treatment liquid contained in a tank, a method in which a treatment liquid is sprayed onto a washing target, a method in which a treatment liquid is flowed onto a washing target, and any combinations thereof. From the viewpoint of the residue removing property, the method in which a washing target is immersed in a treatment liquid is preferable.

A temperature of the treatment liquid is preferably set to 90° C. or lower, more preferably set to 25° C. to 80° C., still more preferably set to 30° C. to 5° C., and particularly preferably set to 40° C. to 65° C.

The washing time can be adjusted depending on the washing method used and the temperature of a treatment liquid.

In the case where washing is performed in an immersion batch mode (a batch mode in which a plurality of sheets of washing targets are immersed in a treatment tank to perform a treatment), the washing time is, for example, 60 minutes or less, preferably 1 to 60 minutes, more preferably 3 to 20 minutes, and still more preferably 4 to 15 minutes.

In the case where a sheet-type washing is performed, the washing time is, for example, 10 seconds to 5 minutes, preferably 15 seconds to 4 minutes, more preferably 15 seconds to 3 minutes, and still more preferably 20 seconds to 2 minutes.

Furthermore, in order to further enhance the washing capability of the treatment liquid, a mechanical stirring method may be used.

Examples of the mechanical stirring method include a method in which a treatment liquid is circulated on a washing target, a method in which a treatment liquid is flowed through or sprayed on a washing target, and a method in which a treatment liquid is stirred with an ultrasonic or a megasonic.

(Rinsing Step B2)

The method for washing a substrate according to the embodiment of the present invention may further have a step (rinsing step B2) of cleaning the washing target by rinsing it with a solvent after the washing step B.

The rinsing step B2 is preferably a step which is performed subsequently after the washing step B, and rinsing is performed with a rinsing solvent (rinsing liquid) over 5 seconds to 5 minutes. The rinsing step B2 may be performed using the above-mentioned mechanical stirring method.

Examples of the rinsing solvent include, but are not limited to, deionized (DI) water, methanol, ethanol, isopropyl alcohol, N-methylpyrrolidinone, γ-butyrolactone, dimethyl sulfoxide, ethyl lactate, and propylene glycol monomethyl ether acetate. Alternatively, an aqueous rinsing liquid (diluted aqueous ammonium hydroxide or the like) with a pH>8 may be used.

As the rinsing solvent, an aqueous ammonium hydroxide solution, DI water, methanol, ethanol, and isopropyl alcohol are preferable, an aqueous ammonium hydroxide solution, DI water, and isopropyl alcohol are more preferable, and an aqueous ammonium hydroxide solution and DI water are still more preferable.

As a method for bringing the rinsing solvent into contact with the washing target, the above-mentioned method in which the treatment liquid is brought into contact with a washing target can be applied in the same manner.

The temperature of the rinsing solvent in the rinsing step B2 is preferably 16° C. to 27° C.

(Drying Step B3)

The method for washing a substrate according to the embodiment of the present invention may have a drying step B3 in which the washing target is dried after the rinsing step B2.

The drying method is not particularly limited. Examples of the drying method include a spin drying method, a method of flowing a dry gas onto a washing target, a method of heating a substrate by a heating means such as a hot plate or an infrared lamp, a Marangoni drying method, a Rotagoni drying method, an isopropyl alcohol (IPA) drying method, or any combinations thereof.

The drying time depends on a specific method used, but in general, is preferably 30 seconds to several minutes.

(Ion Removing Steps F and G)

The method for washing a substrate according to the embodiment of the present invention preferably has at least one step of an ion removing step F of removing Fe ions from at least one of the oxidizing agent, the corrosion inhibitor, or the water before the treatment liquid preparing step A, or an ion removing step G of removing the Fe ions in the treatment liquid after the treatment liquid preparing step A and before performing the washing step B.

It is preferable that the content of Fe with respect to the oxidizing agent in the treatment liquid used in the washing step B is adjusted to be in the above-mentioned range by carrying out at least one of the ion removing step F or the ion removing step G. In particular, there is an advantage in that the content of Fe with respect to the oxidizing agent is easily adjusted to be in the above-mentioned range by carrying out both the ion removing step F and the ion removing step G.

It is possible to maintain good washing performance of the treatment liquid even after the passage of time by adjusting the content of Fe with respect to the oxidizing agent in the treatment liquid to be in the range and reducing the ionic Fe, which is thus excellent in recyclability.

Specific methods for the ion removing step F and the ion removing step G are not particularly limited, and examples thereof include purification by distillation or an ion-exchange membrane.

(Coarse Particle Removing Step H)

The method for washing a substrate according to the embodiment of the present invention preferably has a coarse particle removing step H of removing the coarse particles in the treatment liquid before carrying out the washing step B.

By reducing or removing the coarse particles in the treatment liquid, it is possible to reduce the amount of the coarse particles remaining on the washing target obtained after performing the washing step B. As a result, it is possible to suppress pattern damages caused by the coarse particles on the washing target, and an influence on a yield loss of a device and a decrease in reliability can also be suppressed.

Specific examples of a method for removing the coarse particle include a method in which the treatment liquid obtained after performing the treatment liquid preparing step A is purified by filtering, using a particle removing film having a predetermined particle removal diameter.

In addition, the definition of the coarse particles is as described above.

(Charge Eliminating Steps I and J)

It is preferable that the method for washing a substrate according to the embodiment of the present invention includes at least one step of a charge eliminating step I of subjecting the water to charge elimination before the treatment liquid preparing step A, or a charge eliminating step J of subjecting the treatment liquid to charge elimination after the treatment liquid preparing step A and before performing the washing step B.

It is preferable that a material for a liquid contact portion for supplying the treatment liquid to the washing target is a resin having no metal elution to the treatment liquid in order to maintain the content of Fe with respect to the oxidizing agent to be within a predetermined range. Since such a resin has a low electrical conductivity and insulating properties, in the case where the treatment liquid is allowed to pass through a resin-made pipe, or the case where purification by filtering is performed with a resin-made particle removing film and a resin-made ion-exchange resin film, there is a possibility that the charge potential of the treatment liquid increases, and thus causes electrostatic hazards.

As a result, it is preferable that in the method for washing a substrate according to the embodiment of the present invention, at least one step of the above-mentioned charge eliminating step I or charge eliminating step J is carried out to reduce the charging potential of the treatment liquid. Further, by performing charge elimination, adhesion of foreign matters (coarse particles or the like) onto a substrate or damages (corrosion) on the washing target can be further suppressed.

Specific examples of the charge eliminating method include a method in which water and/or the treatment liquid is brought into contact with an electrically conductive material.

The contact time during which water and/or the treatment liquid, is brought into contact with the electrically conductive material is preferably 0.001 to 1 second, and more preferably 0.01 to 0.1 seconds.

Specific examples of the resin include high-density polyethylene (HDPE), high-density polypropylene (PP), 6,6-nylon, tetrafluoroethylene (PTFE), a tetrafluoroethylene/perfluoroalkylvinyl ether copolymer (PFA), polychlorotrifluoroethylene (PCTFE), an ethylene/chlorotrifluoroethylene copolymer (ECTFE), an ethylene/ethylene tetrafluoride copolymer (ETFE), and an ethylene tetrafluoride/propylene hexafluoride copolymer (FEP).

Examples of the electrically conductive material include stainless steel, gold, platinum, diamond, and glassy carbon.

In the method for washing a substrate using the treatment liquid according to the embodiment of the present invention, it is possible to reuse the drainage of the treatment liquid used in the washing step B, and further use it to wash another washing target.

The method for washing a substrate according to the embodiment of the present invention preferably includes the following steps in the case of an aspect of reusing the drainage of the treatment liquid:

the washing step B;

a drainage recovering step C of recovering a drainage of the treatment liquid used in the washing step B;

a washing step D of washing a newly prepared substrate comprising a metal layer including Co using the recovered drainage of the treatment liquid;

a drainage recovering step E of recovering a drainage of the treatment liquid used in the washing step D; and a step of repeating the washing step D and the drainage recovering step E.

In the aspect of reusing the drainage, the washing step B has the same definition as the washing step B described in the above-mentioned aspect, and a preferred aspect thereof is also the same. Also, in the aspect of reusing the drainage, the method preferably has the ion removing steps F and G, the coarse particle removing step H, and the charge eliminating steps I and J described in the above-mentioned aspect. In addition, the method may have the treatment liquid preparing step A described in the above-mentioned aspect before the washing step B.

The washing step D of performing the washing of the substrate using the recovered drainage of the treatment liquid has the same definition as the washing step B in the above-mentioned aspect, and a preferred aspect thereof is also the same.

A drainage recovering means in the drainage recovering step C or E is not particularly limited. The recovered drainage is preferably stored in the above-mentioned resin-made container in the charge eliminating step J, and the same charge eliminating step as the charge eliminating step J may be performed at this time. In addition, a step in which the recovered drainage is subjected to filtering or the like to remove impurities may be provided.

EXAMPLES

Hereinbelow, the present invention will be described in more detail with reference to Examples. The materials, the amounts and proportions of materials to be used, the treatment details, the treatment procedure, or the like shown in Examples below may be modified as appropriate as long as the modifications do not depart from the spirit of the present invention. Therefore, the scope of the present invention should not be construed as being limited to Examples shown below.

[Preparation of Treatment Liquid]

In the preparation of each of the treatment liquids of Examples and Comparative Examples, the organic solvent and water were subjected to purification by the method described in JP2007-254168A, and used for the preparation of the treatment liquid.

The respective components shown in Table 1 were mixed and stirred to obtain a mixed liquid, and then at least one of a filtering treatment or a filtration treatment of the mixed liquid was performed to obtain each of the treatment liquids of Examples and Comparative Examples. Further, the number of times of each treatment was modified as appropriate such that the content of Fe included in the treatment liquid of each of Examples and Comparative Examples became the content as described in Table 1, and then the treatment was performed.

Furthermore, the preparation, the storage, and the analytic measurements of the treatment liquid were all performed in a clean room at a level satisfying ISO Class 2 or less. Incidentally, the containers used in Examples were used after performing washing with the treatment liquid according to the embodiment of the present invention in advance. In order to enhance the measurement accuracy, in the measurements of the content of Fe and the content of water, measurements at a detection limit or less for common measurements were performed after concentration to 1/100 in terms of a volume, and the contents were calculated in terms of the concentration of the treatment liquid before concentrating.

The components used in the preparation of the respective treatment liquids of Examples and Comparative Examples are as follows.

Furthermore, the pH of each of the treatment liquids was appropriately adjusted using a pH adjuster which will be described later. As the pH adjuster, DBU was used in Examples 14 and 15, and trifluoromethanesulfonic acid was used in Example 22. In the other Examples and Comparative Examples, $H_2SO_4$ or $H_3PO_4$ was used. $H_2SO_4$ or $H_3PO_4$ was used in an amount required for adjustment of pH.

<Polyfunctional Organic Acid>

DTPA: Diethylenetriamine pentaacetic acid (manufactured by Tokyo Kasei Kogyo Co., Ltd.)

Citric acid (manufactured by Wako Pure Chemical Industries, Ltd.)

<Oxidizing Agent>

Hydrogen peroxide (manufactured by Wako Pure Chemical Industries, Ltd.)

Nitric acid (manufactured by Wako Pure Chemical Industries, Ltd.)

Perchloric acid (manufactured by Wako Pure Chemical Industries, Ltd.)

<Organic Solvent>

MSA: Methanesulfonic acid (manufactured by Wako P Chemical Industries, Ltd.)

<Water>

Ultrapure water

<Corrosion Inhibitor>

5-MBTA: 5-Methyl-1H-benzotriazole (manufactured by Wako Pure Chemical Industries, Ltd.)

BTA: Benzotriazole manufactured by Wako Pure Chemical Industries, Ltd.)

TAZ: 1,2,4-Triazole (manufactured by Wako Pure Chemical industries, Ltd.)

ATA: 3-Amino-1,2,4-triazole (manufactured by Wako Pure Chemical Industries, Ltd.)

BA: Boric acid (manufactured by Wako Pure Chemical Industries, Ltd.)

p-BA: Phenylboronic acid (manufactured by Wako Pure Chemical Industries, Ltd.)

FS-3PG: NEWKALGEN FS-3 PG, anion-based surfactant (manufactured by Takemoto Yushi Co., Ltd.)

HLP-1: PHOSTEN HLP-1, anion-based surfactant (manufactured by Nikko Chemicals Co., Ltd.)

$CeCl_3$: Cerium chloride (manufactured by Wako Pure Chemical Industries, Ltd.)

$TiCl_3$: Titanium chloride (manufactured by Wako Pure Chemical Industries, Ltd.)

<Other Components>

(Halide)

HF: Hydrofluoric acid (manufactured by Wako Pure Chemical Industries, Ltd.)

HCl: Hydrochloric acid (manufactured by Wako Pure Chemical Industries, Ltd.)

HBr: Hydrobromic acid (manufactured by Wako Pure Chemical Industries, Ltd.)

HI: Hydroiodic acid (manufactured by Wako Pure Chemical Industries, Ltd.)

(pH Adjuster)

$H_2SO_4$: Sulfuric acid (manufactured by Wako Pure Chemical Industries, Ltd.)

$H_3PO_4$: Phosphoric acid (manufactured by Wako Pure Chemical Industries, Ltd.)

DBU: 1,8-diazabicyclo[5.4.0]undec-7-ene (manufactured by Wako Pure Chemical Industries, Ltd.)

Trifluoromethanesulfonic acid (manufactured by Tokyo Kasei Kogyo Co., Ltd.) (Thickener)

CMC: carboxymethyl cellulose (manufactured by Wako Pure Chemical Industries, Ltd.)

[Measurement of Content]

<Measurement of Content of Fe>

Using the treatment liquids of Examples and Comparative Examples, the content of Fe in the treatment liquid was measured. Specifically, using each of the treatment liquids of Examples and Comparative Examples, the measurement was performed by an ICP-MS method using NexION350S (trade name, manufactured by Perkin Elmer, Inc.). The measurement results are shown in Table 1.

Specific measurement conditions for the ICP-MS method is as follows. Incidentally, the detected amount at a peak intensity for a standard solution at a known concentration was measured and converted in terms of the mass of the metal elements to calculate the content of Fe (the content of Fe atoms) the treatment liquid used in the measurement.

(Measurement Conditions According to ICP-MS Method)
((Standard Substance))

Ultrapure water was metered into a clean glass container, and metal particles to be measured, having a median diameter of 50 nm, were added thereto such that the concentration became 10,000 particles/mL. Then, a dispersion liquid which had been treated with an ultrasonic washing machine for 30 minutes was used as a standard substance for measurement of a transport efficiency.

((ICP-MS Device Used))
Manufacturer: Perkin Elmer, Inc.
Model: NexION350S ((Measurement Condition for ICP-MS))

For ICP-MS, a liquid to be measured was aspirated at about 0.2 mL/min using a PFA-made coaxial nebulizer (in which "PFA" is a copolymer of tetrafluoroethylene and perfluoroalkylvinylether), a quartz-made cyclonic spray chamber, and a quartz-made torch injector with an inner diameter of 1 mm. Cell purge was performed with an amount of oxygen to be added of 0.1 L/min, a plasma output of 1,600 W, and ammonia gas. Time resolution was analyzed at 50 μs.

((Software))

The content of the metal elements was measured using the following analysis software belonging to the manufacturer.
Syngistix for ICP-MS Software <Measurement of Content of Complex Salt of Fe Ion-Polyfunctional Organic Acid>

Quantification of a complex salt produced by complexing a polyfunctional organic acid with a Fe ion was carried out by high performance liquid chromatography (HPLC, manufactured by AgilentTechnologies, Inc.).

[Physical Properties of Treatment Liquid]
<pH>

The pH of each of the treatment liquids of Examples and Comparative Examples at 25° C. was measured using a pH meter (trade name "F-51" manufactured by HORIBA Ltd.).

<Viscosity Ratio>

Using each of the treatment liquids of Examples and Comparative Examples, a viscosity A (at a rotation speed of a rotor of 1,000 rpm) at 25° C. and a viscosity B (at a rotation speed of a rotor of 100 rpm) at 25° C. were measured, and a viscosity ratio (viscosity B/viscosity A) from the obtained values was calculated. For the measurement of the viscosity, a viscometer (trade name "RST-CC", manufactured by Brookfield) was used.

[Evaluation Test]
<Anticorrosion Property (Corrosion Resistance)>
(Measurement of Etching Rate of Co Film (Co ER (Å/min))

A film formed of Co (wiring model, hereinafter also referred to as a "Co film") was prepared, and the anticorrosion property was evaluated, based on the etching rates of the film. The film thickness of the Co film is 1,000 Å. It can be said that in the case where the etching rate is low, the anticorrosion property is excellent, whereas in the case where the etching rate is high, the anticorrosion property is deteriorated.

The Co film was subjected to an etching treatment using each of the treatment liquids of Examples and Comparative Examples. Specifically, the Co film was immersed in the treatment liquid of each of Examples and Comparative Examples for 10 minutes, and the etching rate (Å/min) thereof was calculated, based on a difference in the film thickness of the Co film between before and after the immersion in the treatment liquid.

Furthermore, the film thickness of the Co film before and after the treatment was measured using ellipsometry (spectroscopic ellipsometer, trade name "Vase", manufactured by J. A. Woollam Co.) under the conditions of a measurement range of 250 to 1,000 nm and measurement angles of 70 degrees and 75 degrees, (Measurement of Etching Rate of W Film (W ER (Å/min))

A film formed of tungsten (W) (wiring model, hereinafter also referred to as a "W film") was prepared, and the anticorrosion property was evaluated, based on the etching rates of the film. A specific method for evaluating the anticorrosion property is the same as the above-mentioned evaluation method for the Co film.

(Measurement of Etching Rate of $SiO_2$ Film ($SiO_2$ ER (Å/min))

A film formed of $SiO_2$ (wiring model, hereinafter also referred to as a "$SiO_2$ film") was prepared, and the anticorrosion property was evaluated, based on the etching rates of the film. A specific method for evaluating the anticorrosion property is the same as the above-mentioned evaluation method for the Co film.

<Residue Removing Property>

The residue removing performance was evaluated using each of the prepared treatment liquids. Further, in the following evaluation, a model film formed of $TiO_2$ which is one of residues produced during the plasma etching of the metal hard mask (MHM) was prepared, the etching rate of the film was evaluated, and thus, the residue removing performance was evaluated. That is, it can be said that in the case where the etching rate is high, the residue removing performance is excellent, whereas in the case where the etching rate is low, the residue removing performance is deteriorated.

In addition, the model film formed of $TiO_2$ ($TiO_2$ film) is provided with a film thickness of 1,000 Å on a Si substrate.

After each of the treatment liquids of Examples and Comparative Examples was prepared, the $TiO_2$ film was subjected to an etching treatment. Specifically, the $TiO_2$ film was immersed in each of the treatment liquids of Examples and Comparative Examples for 5 minutes, and the etching rate (Å/min) was calculated, based on a difference in the film thickness between before and after the immersion in the treatment liquid.

Furthermore, the film thickness of the $TiO_2$ film before and after the treatment was measured using ellipsometry (spectroscopic ellipsometer, trade name "Vase", manufactured by J. A. Woollam Co.) under the conditions of a measurement range of 250 to 1,000 nm and measurement angles of 70 degrees and 75 degrees.

Moreover, the calculated etching rates (ER) of the $TiO_2$ film were evaluated in accordance with the following evaluation standard. Further, A to C in the following evaluation standard indicate that requirements for practical use are satisfied.

"A": 5 (Å/min)<ER
"B": 3 (Å/min)<ER≤5(Å/min)
"C": 1 (Å/min)<ER≤3(Å/min)
"D": ER≤1(Å/min)

(Evaluation of In-Plane Uniformity)

A condition for an etching amount at the center of a circular substrate (a model film of $TiO_2$ (a $TiO_2$ film being provided with a film thickness of 1,000 Å on a Si substrate), 12 inches) was set while the time varied, and a time at which the etching depth became 300 Å was observed. Next, at the time, the etching amount was measured at the 90-mm position in the outer circumferential direction from the center of the substrate at a time of etching the entire substrate again, and the in-plane uniformity was evaluated as high as the depth was closer to 300 Å. Specific classifications are as follows. In the following, absolute values of differences S (the etching amount at the center—the etching amount at the 90-mm position) between the two points (the center and the 90-mm position) were measured at five points, and an arithmetic mean value (mean difference) thereof was used.

"A": The mean difference is from −10 Å to 10 Å.
"B": The mean difference is −20 Å or more and less than −10 Å, or more than 10 Å and 20 Å or less.
"C": The mean difference is −30 Å or more and less than −20 Å, or more than 20 Å and 30 Å or less.
"D": The mean difference is less than −30 Å or more than 30 Å (at a level with occurrence of a problem in practical use)

<Defect Performance>

The number of foreign matters with a diameter of 32 nm or more present on the surface of the silicon substrate with a diameter of 300 nm, and the address of each of the foreign matters were measured using a wafer surface inspection device (SP-5, manufactured by KLA-Tencor Corporation).

Furthermore, a wafer for which the number of foreign matters present on the surface of the silicon substrate had been counted was set up in a spinning wafer treatment device (manufactured by EKC Technology, Inc.).

Next, each of the treatment liquids of Examples and Comparative Examples was jetted onto the surface of the set wafer for 1 minute at a flow rate of 1.5 L/min. Thereafter, the wafer was spin-dried.

For the obtained wafer after drying, the number and the address of the foreign matters on the wafer were measured using the wafer surface inspection device.

In addition, for the newly increased foreign matters after spin-drying the treatment liquid, elemental analysis by energy dispersive X-ray (EDX) spectrometry was performed using a defect analyzer (SEM VISION G6, manufactured by APPLIED MATERIALS, Inc.). Fe was used as a target metal element, and foreign matters containing the target metal element were counted as particles. The number of the particles thus obtained was evaluated in accordance with the following evaluation standard. The results are shown in Table 1.

"A": The number of particles with a diameter of 32 nm or more containing the target metal element is 0 or more and less than 100.

"B": The number of particles with a diameter of 32 nm or more containing the target metal element is 100 or more and less than 500.

"C": The number of particles with a diameter of 32 nm or more containing the target metal elements is 500 or more and less than 1,000.

"D": The number of particles with a diameter of 32 nm or more containing the target metal element is 1,000 or more.

[Evaluation Results]

The above evaluation results are shown in Table 1.

Incidentally, the numerical values on the right side as in "10^(−9)" and the like in the tables mean exponents, and specifically "10^(−9)" means "$10^{-9}$". Further, for example, "5^(−11)" in the table means $5 \times 10^{-11}$, and "2^(−10)" means $2 \times 10^{-10}$.

Incidentally, "Å" in the table means 0.1 nm.

Furthermore. "Complex salt of Fe ion-polyfunctional organic acid (ppt by mass)" in the table means a complex salt formed by complexing the Fe ion with the polyfunctional organic acid among the Fe ion and the polyfunctional organic acid that are components included in the treatment liquid.

TABLE 1

| | Treatment liquid Each component | | | | | | | |
|---|---|---|---|---|---|---|---|---|
| | Polyfunctional organic acid (% by mass) | Oxidizing agent (% by mass) | Organic solvent (% by mass) | Corrosion inhibitor (% by mass) | Others (% by mass) | Others (% by mass) | Fe (ppt by mass) | Water (% by mass) |
| Example 1 | DTPA 1.0% | Hydrogen peroxide 1.0% | MSA 77.0% | 5-MBTA 1.0% | $H_2SO_4$ | | 1 | Balance |
| Example 2 | DTPA 1.0% | Hydrogen peroxide 1.0% | MSA 77.0% | 5-MBTA 1.0% | $H_2SO_4$ | | 10^3 | Balance |
| Example 3 | DTPA 1.0% | Hydrogen peroxide 1.0% | MSA 77.0% | 5-MBTA 1.0% | $H_2SO_4$ | | 10^6 | Balance |
| Example 4 | DTPA 1.0% | Hydrogen peroxide 1.0% | MSA 57.0% | 5-MBTA 1.0% | $H_2SO_4$ | | 1 | Balance |
| Example 5 | DTPA 1.0% | Hydrogen peroxide 1.0% | MSA 20.0% | 5-MBTA 1.0% | $H_2SO_4$ | | 1 | Balance |
| Example 6 | DTPA 1.0% | Nitric acid 1.0% | MSA 87.0% | 5-MBTA 1.0% | $H_2SO_4$ | | 1 | Balance |
| Example 7 | DTPA 1.0% | Perchloric acid 1.0% | MSA 87.0% | 5-MBTA 1.0% | $H_2SO_4$ | | 1 | Balance |
| Example 8 | DTPA 1.0% | Hydrogen peroxide 1.0% | MSA 87.0% | 5-MBTA 1.0% | $H_2SO_4$ | | 1 | Balance |
| Example 9 | DTPA 1.0% | Hydrogen peroxide 1.0% | MSA 95.0% | 5-MBTA 1.0% | $H_2SO_4$ | | 1 | Balance |
| Example 10 | DTPA 1.0% | Hydrogen peroxide 1.0% | MSA 77.99% | 5-MBTA 0.0001% | $H_2SO_4$ | | 10^3 | Balance |
| Example 11 | DTPA 1.0% | Hydrogen peroxide 1.0% | MSA 88.0% | 5-MBTA 10.0% | $H_2SO_4$ | | 1 | Balance |
| Example 12 | DTPA 0.0001% | Hydrogen peroxide 1.0% | MSA 77.0% | 5-MBTA 1.0% | $H_2SO_4$ | | 10^3 | Balance |
| Example 13 | DTPA 10.0% | Hydrogen peroxide 1.0% | MSA 77.0% | 5-MBTA 1.0% | $H_2SO_4$ | | 1 | Balance |
| Example 14 | DTPA 1.0% | Hydrogen peroxide 1.0% | MSA 75.0% | 5-MBTA 1.0% | DBU 2% | | 1 | Balance |

TABLE 1-continued

| | | | | | | | |
|---|---|---|---|---|---|---|---|
| Example 15 | DTPA 1.0% | Hydrogen peroxide 1.0% | MSA 72.0% | 5-MBTA 1.0% | DBU 5% | | 1 | Balance |
| Example 16 | DTPA 1.0% | Hydrogen peroxide 1.0% | MSA 77.0% | 5-MBTA 1.0% | $H_2SO_4$ | | 1 | Balance |
| Example 17 | DTPA 1.0% | Hydrogen peroxide 1.0% | MSA 5.0% | 5-MBTA 1.0% | $H_2SO_4$ | | 1 | Balance |
| Example 18 | DTPA 1.0% | Hydrogen peroxide 1.0% | MSA 75.0% | 5-MBTA 1.0% | $H_2SO_4$ | CMC 2% | 1 | Balance |
| Example 19 | DTPA 0.05% | Hydrogen peroxide 0.05% | MSA 79.85% | 5-MBTA 0.05% | $H_2SO_4$ | | 0.05 | Balance |
| Example 20 | DTPA 1.0% | Hydrogen peroxide 0.5% | MSA 77.5% | 5-MBTA 1.0% | $H_2SO_4$ | | 1 | Balance |
| Example 21 | DTPA 1.0% | Hydrogen peroxide 1.0% | MSA 77.0% | 5-MBTA 1.0% | $H_2SO_4$ | | 0.5 | Balance |
| Example 22 | DTPA 1.0% | Hydrogen peroxide 1.0% | MSA 72.0% | 5-MBTA 1.0% | HCl 0.1% | Trifluoromethanesulfonic acid 1% | 1 | Balance |
| Example 23 | DTPA 1.0% | Hydrogen peroxide 1.0% | MSA 78.9% | 5-MBTA 1.0% | HF 0.1% | $H_3PO_4$ | 1 | Balance |
| Example 24 | DTPA 1.0% | Hydrogen peroxide 1.0% | MSA 78.9% | 5-MBTA 1.0% | HCl 0.1% | $H_3PO_4$ | 1 | Balance |
| Example 25 | DTPA 1.0% | Hydrogen peroxide 1.0% | MSA 78.9% | 5-MBTA 1.0% | HBr 0.1% | $H_3PO_4$ | 1 | Balance |
| Example 26 | Citric acid 1.0% | Hydrogen peroxide 1.0% | MSA 78.9% | 5-MBTA 1.0% | HI 0.1% | $H_3PO_4$ | 1 | Balance |
| Example 27 | Citric acid 1.0% | Hydrogen peroxide 1.0% | MSA 78.9% | 5-MBTA 1.0% | HF 0.1% | $H_3PO_4$ | 1 | Balance |
| Example 28 | Citric acid 1.0% | Hydrogen peroxide 1.0% | MSA 78.9% | 5-MBTA 1.0% | HCl 0.1% | $H_3PO_4$ | 1 | Balance |
| Example 29 | DTPA 1.0% | Hydrogen peroxide 1.0% | MSA 77.0% | ATA 1.0% | | $H_3PO_4$ | 1 | Balance |
| Example 30 | DTPA 1.0% | Hydrogen peroxide 1.0% | MSA 77.0% | BTA 1.0% | | $H_3PO_4$ | 1 | Balance |
| Example 31 | DTPA 1.0% | Hydrogen peroxide 1.0% | MSA 77.0% | TAZ 1.0% | | $H_3PO_4$ | 1 | Balance |
| Example 32 | DTPA 1.0% | Hydrogen peroxide 1.0% | MSA 77.0% | BA 1.0% | | $H_3PO_4$ | 1 | Balance |
| Example 33 | DTPA 1.0% | Hydrogen peroxide 1.0% | MSA 77.0% | p-BA 1.0% | | $H_3PO_4$ | 1 | Balance |
| Example 34 | DTPA 1.0% | Hydrogen peroxide 1.0% | MSA 77.0% | FS-3PG 1.0% | | $H_3PO_4$ | 1 | Balance |
| Example 35 | DTPA 1.0% | Hydrogen peroxide 1.0% | MSA 77.0% | HLP-1 1.0% | | $H_3PO_4$ | 1 | Balance |
| Example 36 | DTPA 1.0% | Hydrogen peroxide 1.0% | MSA 77.5% | $TiCl_3$ 0.5% | | $H_3PO_4$ | 1 | Balance |
| Example 37 | DTPA 1.0% | Hydrogen peroxide 1.0% | MSA 77.5% | $CeCl_3$ 0.5% | | $H_3PO_4$ | 1 | Balance |
| Comparative Example 1 | DTPA 1.0% | Hydrogen peroxide 1.0% | MSA 78.0% | | | $H_3PO_4$ | 1 | Balance |
| Comparative Example 2 | DTPA 1.0% | Hydrogen peroxide 1.0% | MSA 77.0% | 5-MBTA 1.0% | | $H_3PO_4$ | $10^7$ | Balance |
| Comparative Example 3 | DTPA 1.0% | Hydrogen peroxide 1.0% | MSA 68.0% | 5-MBTA 1.0% | | $H_3PO_4$ | 0.1 | Balance |

| | Treatment liquid | | | |
|---|---|---|---|---|
| | Fe/oxidizing agent (mass ratio) | Fe/corrosion inhibitor (mass ratio) | Fe/polyfunctional organic acid (mass ratio) | Complex salt of Fe ion-polyfunctional organic acid (ppt by mass) |
| Example 1 | $10^{-10}$ | $10^{-10}$ | $10^{-10}$ | 10 |
| Example 2 | $10^{-7}$ | $10^{-7}$ | $10^{-7}$ | $10^2$ |
| Example 3 | $10^{-4}$ | $10^{-4}$ | $10^{-4}$ | $10^4$ |
| Example 4 | $10^{-10}$ | $10^{-10}$ | $10^{-10}$ | 10 |
| Example 5 | $10^{-10}$ | $10^{-10}$ | $10^{-10}$ | 10 |
| Example 6 | $10^{-10}$ | $10^{-10}$ | $10^{-10}$ | 10 |
| Example 7 | $10^{-10}$ | $10^{-10}$ | $10^{-10}$ | 10 |
| Example 8 | $10^{-10}$ | $10^{-10}$ | $10^{-10}$ | 10 |
| Example 9 | $10^{-10}$ | $10^{-10}$ | $10^{-10}$ | 10 |
| Example 10 | $10^{-7}$ | $10^{-3}$ | $10^{-7}$ | $10^2$ |
| Example 11 | $10^{-10}$ | $10^{-11}$ | $10^{-10}$ | 10 |
| Example 12 | $10^{-7}$ | $10^{-7}$ | $10^{-3}$ | $10^2$ |
| Example 13 | $10^{-10}$ | $10^{-10}$ | $10^{-11}$ | 10 |
| Example 14 | $10^{-10}$ | $10^{-10}$ | $10^{-10}$ | 10 |
| Example 15 | $10^{-10}$ | $10^{-10}$ | $10^{-10}$ | 10 |
| Example 16 | $10^{-10}$ | $10^{-10}$ | $10^{-10}$ | 10 |
| Example 17 | $10^{-10}$ | $10^{-10}$ | $10^{-10}$ | 10 |
| Example 18 | $10^{-10}$ | $10^{-10}$ | $10^{-10}$ | 10 |
| Example 19 | $10^{-10}$ | $10^{-10}$ | $10^{-10}$ | 10 |

TABLE 1-continued

| | | | | |
|---|---|---|---|---|
| Example 20 | 10^(−10) | 5^(−11) | 5^(−11) | 10 |
| Example 21 | 10^(−10) | 10^(−10) | 10^(−10) | 5 |
| Example 22 | 10^(−10) | 10^(−10) | 10^(−10) | 10 |
| Example 23 | 10^(−10) | 10^(−10) | 10^(−10) | 10 |
| Example 24 | 10^(−10) | 10^(−10) | 10^(−10) | 10 |
| Example 25 | 10^(−10) | 10^(−10) | 10^(−10) | 10 |
| Example 26 | 10^(−10) | 10^(−10) | 10^(−10) | 10 |
| Example 27 | 10^(−10) | 10^(−10) | 10^(−10) | 10 |
| Example 28 | 10^(−10) | 10^(−10) | 10^(−10) | 10 |
| Example 29 | 10^(−10) | 10^(−10) | 10^(−10) | 10 |
| Example 30 | 10^(−10) | 10^(−10) | 10^(−10) | 10 |
| Example 31 | 10^(−10) | 10^(−10) | 10^(−10) | 10 |
| Example 32 | 10^(−10) | 10^(−10) | 10^(−10) | 10 |
| Example 33 | 10^(−10) | 10^(−10) | 10^(−10) | 10 |
| Example 34 | 10^(−10) | 10^(−10) | 10^(−10) | 10 |
| Example 35 | 10^(−10) | 10^(−10) | 10^(−10) | 10 |
| Example 36 | 10^(−10) | 2^(−10) | 10^(−10) | 10 |
| Example 37 | 10^(−10) | 2^(−10) | 10^(−10) | 10 |
| Comparative Example 1 | 10^(−10) | — | 10^(−10) | 10 |
| Comparative Example 2 | 10^(−3) | 10^(−3) | 10^(−3) | 10^6 |
| Comparative Example 3 | 10^(−12) | 10^(−11) | 10^(−11) | 1 |

| | Physical properties | | Evaluation results | | | | |
|---|---|---|---|---|---|---|---|
| | | Viscosity ratio | Anticorrosion property | | | Residue | | |
| | pH | (viscosity B/viscosity A) | Co ER (Å/min) | W ER (Å/min) | SiO$_2$ ER (Å/min) | removing capability | Defect performance | In-plane uniformity |
| Example 1 | −2 | 1 | 23 | 15 | <1 | B | A | A |
| Example 2 | −2 | 1 | 22 | 14 | <1 | B | B | A |
| Example 3 | −2 | 1 | 25 | 15 | <1 | B | C | A |
| Example 4 | −2 | 1.5 | 35 | 18 | <1 | B | A | B |
| Example 5 | −2 | 2.5 | 59 | 35 | <1 | B | A | B |
| Example 6 | −2 | 1 | 27 | 17 | <1 | B | A | A |
| Example 7 | −2 | 1 | 33 | 17 | <1 | B | A | A |
| Example 8 | −2 | 1 | 13 | 8 | <1 | B | A | A |
| Example 9 | −2 | 1 | 6 | 3 | <1 | C | A | A |
| Example 10 | −2 | 1 | 56 | 15 | <1 | C | B | A |
| Example 11 | −2 | 1 | 15 | 9 | <1 | C | A | A |
| Example 12 | −2 | 1 | 45 | 15 | <1 | C | C | A |
| Example 13 | −2 | 1 | 38 | 20 | <1 | B | C | C |
| Example 14 | 1 | 1 | 23 | 15 | <1 | B | A | A |
| Example 15 | 3 | 1 | 23 | 15 | <1 | B | A | A |
| Example 16 | 6 | 1 | 32 | 102 | <1 | B | C | A |
| Example 17 | −2 | 30 | 23 | 15 | <1 | B | A | C |
| Example 18 | −2 | 0.1 | 23 | 15 | <1 | B | A | C |
| Example 19 | −2 | 1 | 23 | 15 | <1 | C | B | A |
| Example 20 | −2 | 1 | 23 | 15 | <1 | C | B | A |
| Example 21 | −2 | 1 | 23 | 15 | <1 | B | C | A |
| Example 22 | −4 | 1 | 23 | 15 | <1 | B | C | A |
| Example 23 | −2 | 1 | 24 | 8 | 2 | A | A | A |
| Example 24 | −2 | 1 | 23 | 13 | <1 | A | A | A |
| Example 25 | −2 | 1 | 24 | 14 | <1 | A | A | A |
| Example 26 | −2 | 1 | 25 | 11 | <1 | A | A | A |
| Example 27 | −2 | 1 | 25 | 11 | 2 | A | A | A |
| Example 28 | −2 | 1 | 24 | 10 | <1 | A | A | A |
| Example 29 | −2 | 1 | 27 | 14 | <1 | A | A | A |
| Example 30 | −2 | 1 | 33 | 12 | <1 | A | A | A |
| Example 31 | −2 | 1 | 28 | 11 | <1 | A | A | A |
| Example 32 | −2 | 1 | 15 | 13 | <1 | A | A | A |
| Example 33 | −2 | 1 | 13 | 13 | <1 | A | A | A |
| Example 34 | −2 | 1 | 12 | 14 | <1 | A | A | A |
| Example 35 | −2 | 1 | 15 | 15 | <1 | A | A | A |
| Example 36 | −2 | 1 | 12 | 14 | <1 | A | A | A |
| Example 37 | −2 | 1 | 15 | 15 | <1 | A | A | A |
| Comparative Example 1 | −2 | 1 | 152 | 21 | <1 | A | A | A |
| Comparative Example 2 | −2 | 1 | 35 | 14 | <1 | D | D | A |
| Comparative Example 3 | −2 | 1 | 35 | 14 | <1 | D | D | A |

As shown in Table 1, it was found that with the treatment liquids of Examples, it is possible to provide a treatment liquid which has an excellent anticorrosion property with respect to a metal layer included in a semiconductor device and an excellent residue removing property, and is capable of suppressing the generation of defects.

In comparison of Examples 1 to 3, 10, and 11, it was found that in the case where the content ratio of the Fe to the corrosion inhibitor is $10^{-10}$ to $10^{-4}$ in terms of mass ratio, the anticorrosion property with respect to a metal layer included in a semiconductor device is more excellent and the residue removing property is more excellent.

In comparison of Examples 1 to 3, 12, and 13, it was found that in the case where the content ratio of the Fe to the polyfunctional organic acid is $10^{-10}$ to $10^{-4}$ in terms of mass ratio, the anticorrosion property with respect to a metal layer included in a semiconductor device is more excellent and the generation of defects is further suppressed.

In comparison of Examples 1, 14, 15, 16, and 22, it was found that in the case where the pH of the treatment liquid is −3.0 to 5.0, the anticorrosion property with respect to a metal layer included in a semiconductor device is more excellent and the generation of defects is further suppressed.

In comparison of Examples 1, 17, and 18, it was found that in the case where the ratio (viscosity B/viscosity A) of the viscosity of the treatment liquid at a rotation speed of 100 rpm (viscosity B) to the viscosity of the treatment liquid at a rotation speed of 1,000 rpm (viscosity A) is 1 to 20, the in-plane uniformity is more excellent.

In comparison of Examples 6 to 8, it was found that in the case where hydrogen peroxide is used as an oxidizing agent, the anticorrosion property with respect to a metal layer included in a semiconductor device is more excellent.

In comparison of Examples 1 to 3, and 19, it was found that in the case where the content of Fe in the treatment liquid is 0.1 ppt by mass to 10 ppb by mass, both the residue removing property and the defect suppressing performance can be satisfied at a more excellent level (any of the residue removing property and the defect performance is evaluated to "B" or higher).

In comparison of Examples 1 to 3, and 21, it was found that in the case where the concentration of the complex salt formed by complexing the polyfunctional organic acid with the Fe ion in the treatment liquid is 10 ppt by mass to 5 ppb by mass, both the residue removing property and the defect suppressing performance can be satisfied at a more excellent level (any of the residue removing property and the defect performance is evaluated to "B" or higher).

From the results of Examples 4 and 5, it was found that the treatment liquid according to the embodiment of the present invention can be applied to any one of a water-based treatment liquid and an organic solvent-based treatment liquid.

On the other hand, from the comparison of Examples 9 and 1, it was found that in the case where the content of water is small as in Example 9, the anticorrosive performance is improved, hut the residue removing property is lowered.

In the comparison of Examples 1, and 23 to 28, it was found that in the case where the treatment liquid contains a halogen compound, the residue removing property is more excellent.

In comparison of Examples 1, and 29 to 37, it was found that in the case where the treatment liquid contains a corrosion inhibitor with a specific structure, the anticorrosion property with respect to a metal layer included in a semiconductor device is more excellent, and the residue removing properly is also more excellent.

On the other hand, it was found that in the case where the treatment liquid does not contain a corrosion inhibitor, the anticorrosion property with respect to the metal layer is deteriorated (Comparative Example 1).

In addition, it was found that in the case where the mass ratio of Fe to hydrogen peroxide is less than $10^{-10}$ and more than $10^{-4}$, the generation of defects becomes noticeable (Comparative Examples 2 and 3).

<Charge Eliminating Test and Evaluation Results>

For the treatment liquid of Example 1, the above-mentioned respective evaluation tests were carried out in the same manner except that charge elimination was performed in advance with SUS316, a grounded material, and the immersion time was set to 20 minutes (Example 1A).

The results are shown in Table 2.

As a result of the evaluations, with any of the treatment liquids, in any of the case where the charge eliminating step had been performed and the case where the charge eliminating step had not been performed, the residue removing performance was not changed. Further, in the evaluation of the anticorrosion property and the defect performance, a result showing that the anticorrosion property and the defect performance were more excellent in the case where the charge eliminating step had been performed was obtained.

From these results, it could be seen that the anticorrosion property and the defect suppressing performance were more excellent by performing the charge eliminating step (further, it was found that the detect performance was evaluated as "A" in both cases, but the number of particles was further reduced in the case where the charge eliminating step had been performed).

<Recycling Test and Evaluation Results>

For the treatment liquid of Example 1, the respective treatments in the respective evaluation tests were consecutively performed five times. Thereafter, the recovered liquid was returned to the tank, and the liquid was subjected to each of the evaluations again (That is, each of 5 objects to be treated was consecutively treated while not changing the treatment liquid, and the $6^{th}$ object to be treated was subjected to the above-mentioned evaluations to evaluate various performances) (Example 1B).

In addition, with the treatment liquid of Example 1, the evaluation (Example 1C) after 25 consecutive treatments and the evaluation (Example 1D) after 26 consecutive treatments were respectively carried out by the same method as in Example 1B.

The results are shown in Table 2.

As a result of the evaluations, it could be seen that the results of various evaluations were not changed in both the case where the recycling test was performed and the case where the recycling test was not performed. From the result, it could be seen that in the case where the treatment liquid according to the embodiment of the present invention was repeatedly used to treat the substrate, it could be used with no substantial change in the performance, the recyclability was excellent.

On the other hand, with the treatment liquid of Comparative Example 2, the evaluation (Comparative Example 2A) after 25 consecutive treatments and the evaluation (Comparative Example 2B) after 26 consecutive treatments were respectively carried out by the same method as above, and as a result, it could be seen that the anticorrosion property and the residue removing property were deteriorated after the recycling test.

TABLE 2

| | Treatment liquid Each component | | | | | | | | |
|---|---|---|---|---|---|---|---|---|---|
| | Polyfunctional organic acid (% by mass) | Oxidizing agent (% by mass) | Organic solvent (% by mass) | Water (% by mass) | Corrosion inhibitor (% by mass) | Others (% by mass) | Fe (ppt by mass) | Fe/oxidizing agent (mass ratio) | Fe/corrosion inhibitor (mass ratio) |
| Example 1 | DTPA 1.0% | Hydrogen peroxide 1.0% | MSA 77.0% | Water 20% | 5-MBTA 1.0% | $H_2SO_4$ | 1 | $10^{-10}$ | $10^{-10}$ |
| Example 1A | DTPA 1.0% | Hydrogen peroxide 1.0% | MSA 77.0% | Water 20% | 5-MBTA 1.0% | $H_2SO_4$ | 1 | $10^{-10}$ | $10^{-10}$ |
| Example 1B | DTPA 1.0% | Hydrogen peroxide 1.0% | MSA 77.0% | Water 20% | 5-MBTA 1.0% | $H_2SO_4$ | 1 | $10^{-10}$ | $10^{-10}$ |
| Example 1C | DTPA 1.0% | Hydrogen peroxide 1.0% | MSA 77.0% | Water 20% | 5-MBTA 1.0% | $H_2SO_4$ | 1 | $10^{-10}$ | $10^{-10}$ |
| Example 1D | DTPA 1.0% | Hydrogen peroxide 1.0% | MSA 77.0% | Water 20% | 5-MBTA 1.0% | $H_2SO_4$ | 1 | $10^{-10}$ | $10^{-10}$ |
| Comparative Example 2 | DTPA 1.0% | Hydrogen peroxide 1.0% | MSA 77.0% | Water 20% | 5-MBTA 1.0% | $H_2SO_4$ | $10^7$ | $10^{-3}$ | $10^{-3}$ |
| Comparative Example 2A | DTPA 1.0% | Hydrogen peroxide 1.0% | MSA 77.0% | Water 20% | 5-MBTA 1.0% | $H_2SO_4$ | $10^7$ | $10^{-3}$ | $10^{-3}$ |
| Comparative Example 2B | DTPA 1.0% | Hydrogen peroxide 1.0% | MSA 77.0% | Water 20% | 5-MBTA 1.0% | $H_2SO_4$ | $10^7$ | $10^{-3}$ | $10^{-3}$ |

| | Treatment liquid | | | | |
|---|---|---|---|---|---|
| | | Complex salt of Fe | Physical properties | | |
| | Fe/polyfunctional organic acid (mass ratio) | ion-polyfunctional organic acid (ppt by mass) | pH | Viscosity ratio (viscosity B/viscosity A) | Number of cycles |
| Example 1 | $10^{-10}$ | 10 | −2 | 1 | $1^{st}$ |
| Example 1A | $10^{-10}$ | 10 | −2 | 1 | $1^{st}$ |
| Example 1B | $10^{-10}$ | 10 | −2 | 1 | $5^{th}$ |
| Example 1C | $10^{-10}$ | 10 | −2 | 1 | $25^{th}$ |
| Example 1D | $10^{-10}$ | 10 | −2 | 1 | $26^{th}$ |
| Comparative Example 2 | $10^{-3}$ | $10^6$ | −2 | 1 | $1^{st}$ |
| Comparative Example 2A | $10^{-3}$ | $10^6$ | −2 | 1 | $25^{th}$ |
| Comparative Example 2B | $10^{-3}$ | $10^6$ | −2 | 1 | $26^{th}$ |

| | | Evaluation results | | | | | |
|---|---|---|---|---|---|---|---|
| | Charge eliminating step | Anticorrosion property | | | Residue removing capability | Defect performance | In-plane uniformity |
| | | Co ER (Å/min) | W ER (Å/min) | $SiO_2$ ER (Å/min) | | | |
| Example 1 | Not performed | 23 | 15 | <1 | B | A | A |
| Example 1A | Performed | 15 | 10 | <1 | B | A | A |
| Example 1B | Not performed | 24 | 14 | <1 | B | A | A |
| Example 1C | Not performed | 25 | 15 | <1 | B | A | A |
| Example 1D | Not performed | 29 | 18 | <1 | B | A | A |
| Comparative Example 2 | Not performed | 35 | 14 | <1 | C | D | A |
| Comparative Example 2A | Not performed | 38 | 17 | <1 | D | D | A |
| Comparative Example 2B | Not performed | 40 | 18 | <1 | D | D | A |

EXPLANATION OF REFERENCES 1 substrate
2 metal layer
3 etching stop layer
4 interlayer insulating layer
5 metal hard mask
6 hole
10 laminate
11 inner wall
11a cross-sectional wall
11b bottom wall
12 dry etching residue

What is claimed is:

1. A treatment liquid for a semiconductor device, comprising:
    an oxidizing agent;
    a corrosion inhibitor;
    water; and
    Fe,
    wherein the content ratio of the Fe to the oxidizing agent is $10^{-10}$ to $10^{-4}$ in terms of mass ratio.
2. The treatment liquid according to claim 1, wherein the oxidizing agent is hydrogen peroxide.
3. The treatment liquid according to claim 1, wherein the content ratio of the Fe to the corrosion inhibitor is $10^{-10}$ to $10^{-4}$ in terms of mass ratio.
4. The treatment liquid according to claim 1, wherein the content of the Fe is 0.1 ppt by mass to 10 ppb by mass with respect to the total mass of the treatment liquid.
5. The treatment liquid according to claim 1, further comprising an organic solvent.
6. The treatment liquid according to claim 5, wherein the content of the water is 20% to 98% by mass, and
    the content of the organic solvent is 1% to 40% by mass, with respect to the total mass of the treatment liquid.
7. The treatment liquid according to claim 5, wherein the content of the water is 1% to 40% by mass, and
    the content of the organic solvent is 20% to 98% by mass, with respect to the total mass of the treatment liquid.
8. The treatment liquid according to claim 1, further comprising a polyfunctional organic acid.
9. The treatment liquid according to claim 8, wherein the content ratio of the Fe to the polyfunctional organic acid is $10^{-10}$ to $10^{-4}$ in terms of mass ratio.
10. The treatment liquid according to claim 8, wherein the concentration of a complex salt formed by complexing the polyfunctional organic acid with the Fe ion in the treatment liquid is 10 ppt by mass to 5 ppb by mass.
11. The treatment liquid according to claim 1, further comprising a halide.
12. The treatment liquid according to claim 1, wherein the pH of the treatment liquid is −3.0 to 5.0.
13. The treatment liquid according to claim 1, wherein in the case where the viscosity of the treatment liquid at 25° C. is measured using a rotational viscometer, the ratio of the viscosity of the treatment liquid at a rotation speed of 100 rpm to the viscosity of the treatment liquid at a rotation speed of 1,000 rpm is 1 to 20.
14. The treatment liquid according to claim 1, wherein the semiconductor device has a substrate comprising a metal layer including Co, and
    the treatment liquid is used in a treatment for the metal layer.
15. The treatment liquid according to claim 1, wherein the semiconductor device has a substrate comprising a metal layer including W, and
    the treatment liquid is used in a treatment for the metal layer.
16. The treatment liquid according to claim 1, wherein the semiconductor device has a substrate comprising an insulating layer including any one selected from SiOx, SiOC, or SiN, and
    the treatment liquid is used in a treatment for the insulating layer.
17. The treatment liquid according to claim 1, wherein the corrosion inhibitor includes at least one compound selected from a triazole represented by Formula (A), a boronic acid represented by Formula (B), a metal chloride represented by Formula (C), a substituted or unsubstituted tetrazole, or a surfactant,

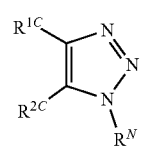

Formula (A)

in Formula (A), $R^{1C}$, $R^{2C}$, and $R^N$ each independently represent a hydrogen atom, or a substituted or unsubstituted hydrocarbon group, and $R^{1C}$ and $R^{2C}$ may be bonded to each other to form a ring;

in Formula (B), R represents a hydroxyl group, or a substituted or unsubstituted hydrocarbon group; and

in Formula (C), M represents a cerium atom or a metal atom selected from Group 4, and x represents the valence of M.

* * * * *